(12) United States Patent
Shiraki et al.

(10) Patent No.: US 9,941,232 B2
(45) Date of Patent: Apr. 10, 2018

(54) ELECTRONIC COMPONENT DEVICE

(71) Applicant: SHINKO ELECTRIC INDUSTRIES CO., LTD., Nagano-shi, Nagano (JP)

(72) Inventors: Satoshi Shiraki, Nagano (JP); Koichi Tanaka, Nagano (JP); Masahiro Kyozuka, Nagano (JP); Tomohiro Suzuki, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/247,433

(22) Filed: Aug. 25, 2016

(65) Prior Publication Data
US 2017/0062370 A1 Mar. 2, 2017

(30) Foreign Application Priority Data
Aug. 31, 2015 (JP) .................................. 2015-170266

(51) Int. Cl.
*H01L 23/48* (2006.01)
*H01L 23/00* (2006.01)
(Continued)

(52) U.S. Cl.
CPC .............. *H01L 24/16* (2013.01); *H01L 23/29* (2013.01); *H01L 23/3107* (2013.01);
(Continued)

(58) Field of Classification Search
CPC ........... H01L 21/76852; H01L 21/4825; H01L 21/76879; H01L 23/4952; H01L 23/49527; H01L 23/49894; H01L 23/528; H01L 23/53204; H01L 23/49816; H01L 23/49822; H01L 23/5226
See application file for complete search history.

(56) References Cited

U.S. PATENT DOCUMENTS

| 2008/0184555 A1* | 8/2008 | Machida ................ H05K 3/462 |
| | | 29/830 |
| 2009/0135575 A1* | 5/2009 | Kajiki .................... H05K 1/144 |
| | | 361/803 |

(Continued)

FOREIGN PATENT DOCUMENTS

JP 2003-347722 12/2003

*Primary Examiner* — A. Sefer
(74) *Attorney, Agent, or Firm* — Rankin, Hill & Clark LLP

(57) ABSTRACT

An electronic component device includes: a lower wiring substrate; an electronic component on the lower wiring substrate; an upper wiring substrate disposed above the lower wiring substrate and the electronic component; a bump conductor disposed between the lower wiring substrate and the upper wiring substrate to electrically connect the lower wiring substrate and the upper wiring substrate; and a sealing resin provided between the lower wiring substrate and the upper wiring substrate to seal the electronic component and the bump conductor. The upper wiring substrate includes: a first wiring layer directly connected to the bump conductor; and a first insulating layer having an opening portion through which the first wiring layer is exposed and disposed to cover the first wiring layer. The first wiring layer and the first insulating layer are not opposed to the electronic component in a thickness direction of the electronic component device.

10 Claims, 25 Drawing Sheets

(51) Int. Cl.
*H01L 23/29* (2006.01)
*H01L 23/31* (2006.01)
*H01L 23/522* (2006.01)
*H01L 23/498* (2006.01)

(52) U.S. Cl.
CPC .. *H01L 23/49816* (2013.01); *H01L 23/49822* (2013.01); *H01L 23/5226* (2013.01); *H01L 2924/01029* (2013.01)

(56) References Cited

U.S. PATENT DOCUMENTS

| | | | |
|---|---|---|---|
| 2014/0054773 A1* | 2/2014 | Kurashima | H01L 23/28 257/738 |
| 2014/0063768 A1* | 3/2014 | Tanaka | H01L 23/3121 361/784 |
| 2014/0225275 A1* | 8/2014 | Shimizu | H01L 23/49827 257/774 |
| 2016/0035661 A1* | 2/2016 | Suzuki | H01L 23/49822 174/251 |

* cited by examiner

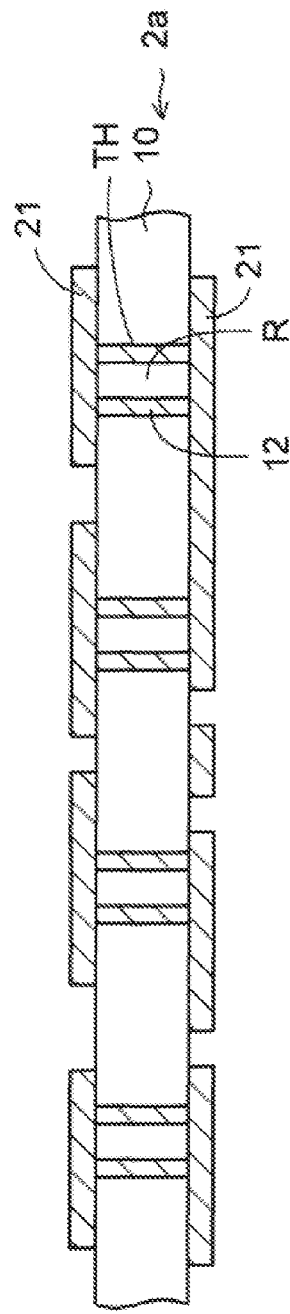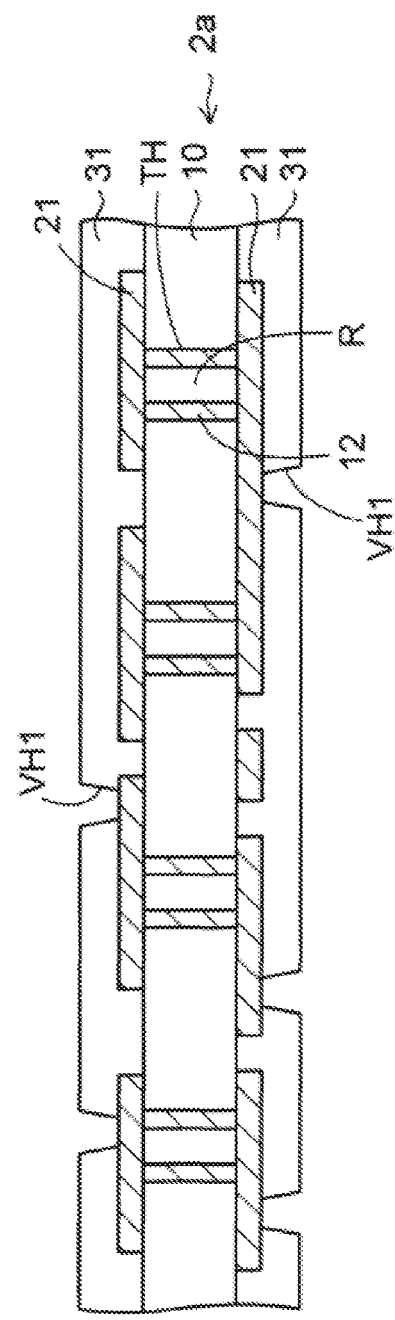
FIG. 2A
FIG. 2B

REDUCED PLAN VIEW

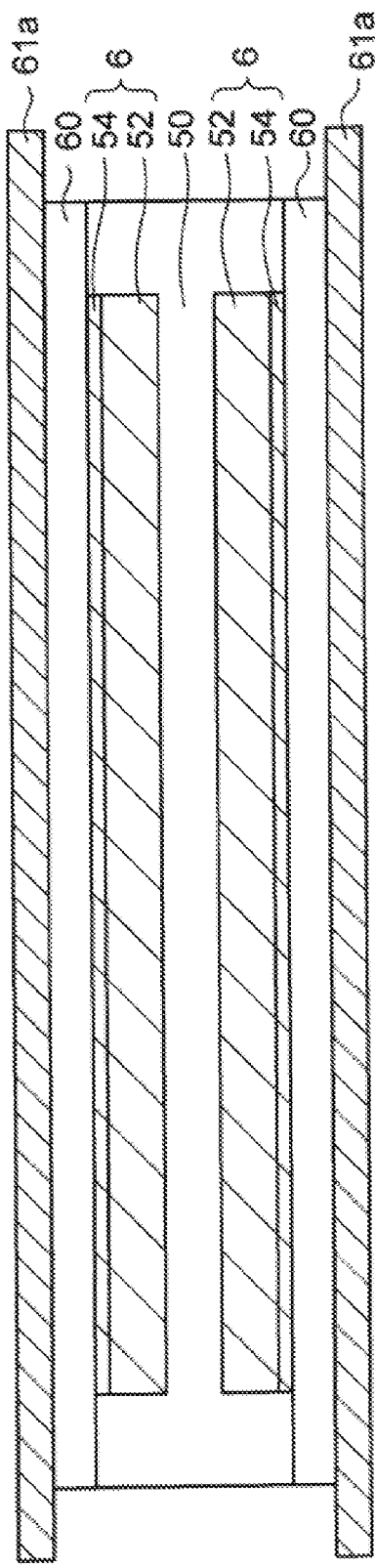

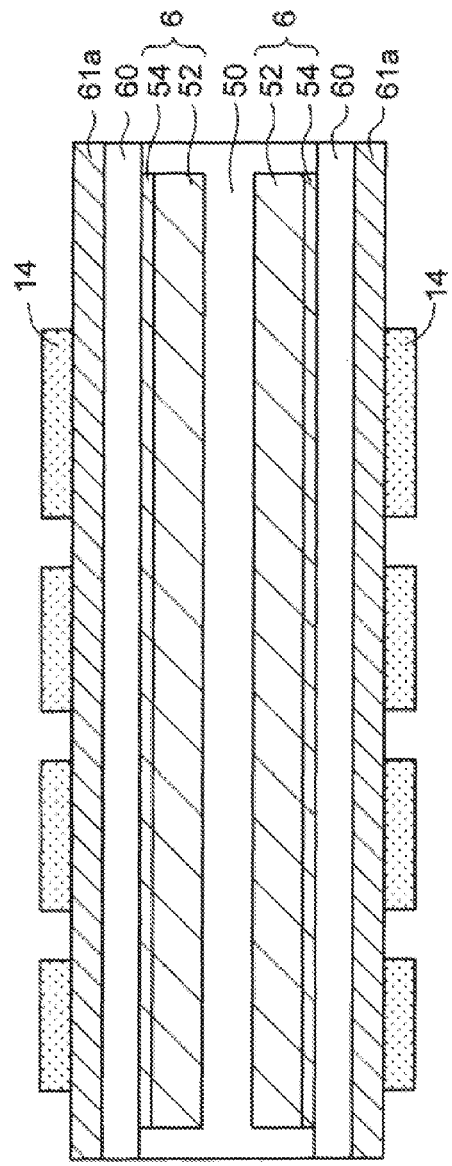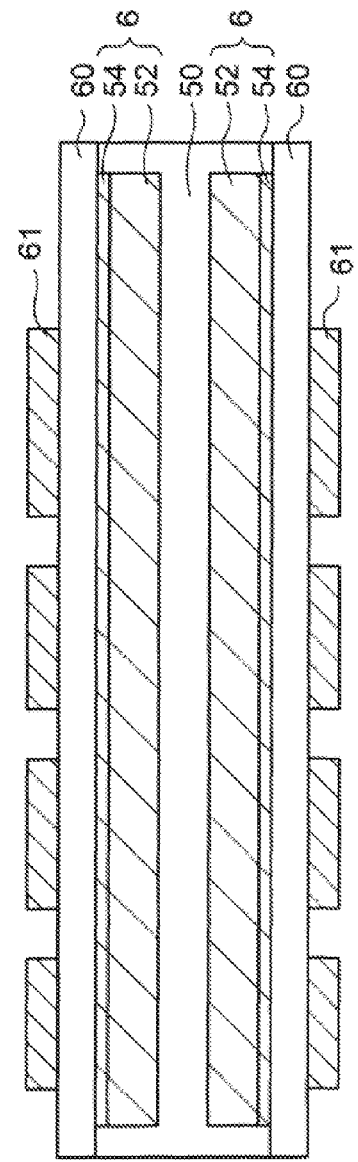
FIG. 10A
FIG. 10B

REDUCED PLAN VIEW

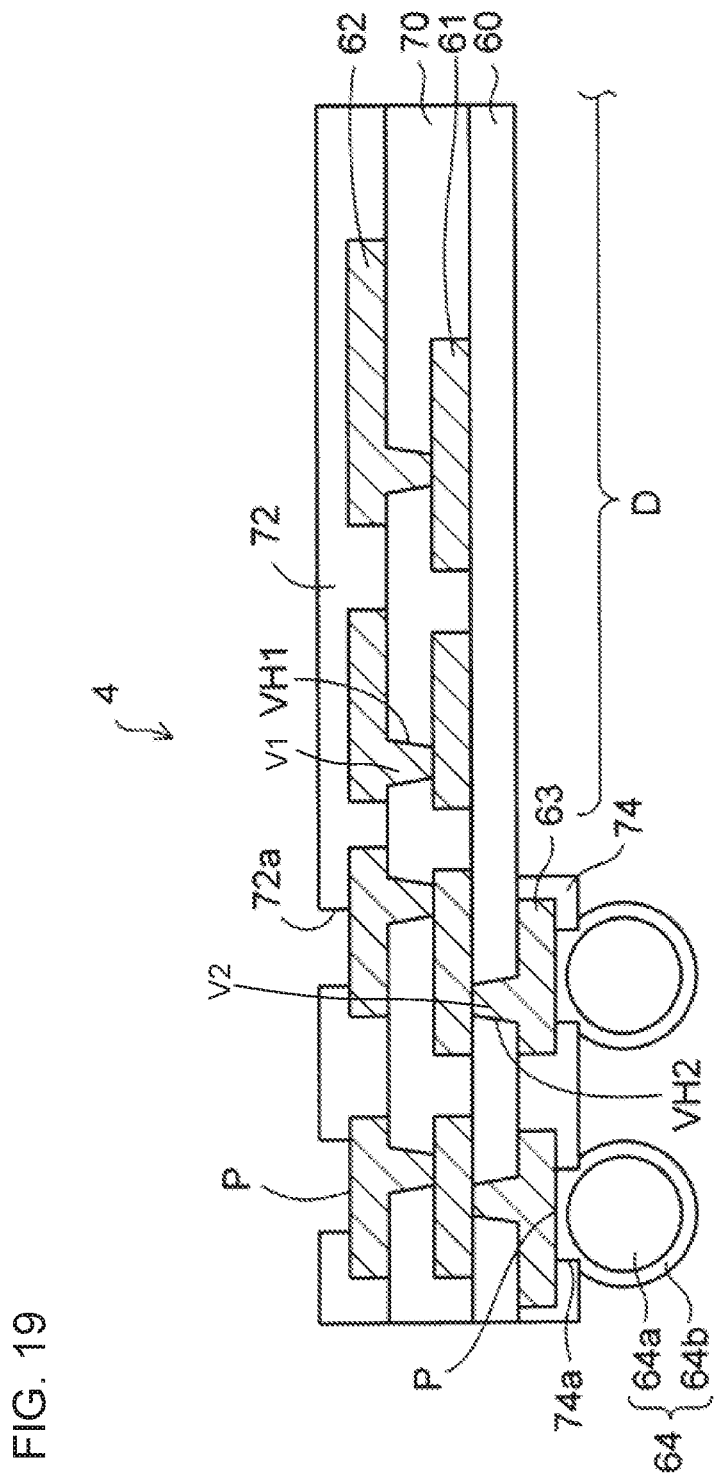

ELECTRONIC COMPONENT DEVICE

This application claims priority from Japanese Patent Application No. 2015-170266, filed on Aug. 31, 2015, the entire contents of which are herein incorporated by reference.

BACKGROUND

1. Technical Field

The present disclosure relates to an electronic component device.

2. Description of the Related Art

With the recent development of an electronic device, a wiring board of an electronic component device for use in the electronic device has been required to be smaller in size and higher in performance. To meet the requirements, an electronic component built-in board in which an electronic component is built in a wiring board has been put into practical use.

In an example of such an electronic component built-in board, an upper wiring substrate is provided above a lower wiring substrate with the interposition of solder balls therebetween. The lower wiring substrate is mounted with a semiconductor chip. A space between the lower wiring substrate and the upper wiring substrate is filled with a sealing resin for sealing the semiconductor chip (see e.g., JP-A-2003-347722).

As will be described in a preliminary matter which will be described later, there is an electronic component device in which an upper wiring substrate is provided above a lower wiring substrate with the interposition of conductive balls therebetween, and the lower wiring substrate is mounted with a semiconductor chip. In such an electronic component device, the diameter of each of the conductive balls is required to be reduced in order to cope with the narrowed pitch of connection portions of the lower wiring substrate and the upper wiring substrate.

When the diameter of the conductive ball is reduced, the gap between the semiconductor chip and the upper wiring substrate is narrowed. For this reason, there is a likelihood that it may be not possible to well fill a space between the lower wring substrate and the upper wiring substrate with a sealing resin when the sealing resin is poured into the space.

SUMMARY

According to one or more aspects of the present disclosure, there is provided an electronic component device. The electronic component device includes: a lower wiring substrate; an electronic component disposed on the lower wiring substrate; an upper wiring substrate disposed above the lower wiring substrate and the electronic component; a bump conductor disposed between the lower wiring substrate and the upper wiring substrate so as to electrically connect the lower wiring substrate and the upper wiring substrate; and a sealing resin provided between the lower wiring substrate and the upper wiring substrate so as to seal the electronic component and the bump conductor. The upper wiring substrate includes: a first wiring layer directly connected to the bump conductor; and a first insulating layer having an opening portion through which the first wiring layer is exposed and disposed to cover the first wiring layer. The first wiring layer and the first insulating layer are not opposed to the electronic component in a thickness direction of the electronic component device.

According to one or more aspects of the present disclosure, in an electronic component device in which the upper wiring substrate is provided above a lower wiring substrate with the interposition of the bump conductors therebetween and the lower wiring substrate is mounted with the electronic component, it is possible to provide a novel structure in which an interval between an electronic component and an upper wiring substrate can be secured sufficiently even when bump conductors are disposed at a narrowed pitch

BRIEF DESCRIPTION OF THE DRAWINGS

FIGS. 2A and 2B are sectional views (part 1) showing a method for manufacturing a lower wiring substrate for use in an electronic component device according to an embodiment;

FIG. 9 is a sectional view (part 2) showing the method for manufacturing the upper wiring substrate for use in the electronic component device according to the embodiment;

FIGS. 10A and 10B are sectional views (part 3) showing the method for manufacturing the upper wiring substrate for use in the electronic component device according to the embodiment;

FIG. 19 is a sectional view showing the upper wiring substrate for use in the electronic component device according to the embodiment;

DETAILED DESCRIPTION

Embodiments will be described below respectively with reference to the accompanying drawings. Incidentally, a characteristic part is enlarged and shown in some accompanying drawings for convenience's sake in order to make it easy to understand that characteristic, and the dimensional ratios etc. of respective constituent elements do not always agree with real ones. In addition, hatching of a part of members may be omitted in each sectional view in order to make it easy to understand the sectional structure of each member.

A preliminary matter underlying the embodiment will be described prior to description of the embodiment. Statement of the preliminary matter contains the details of personal study of the present inventor rather than known techniques.

Figure 1:
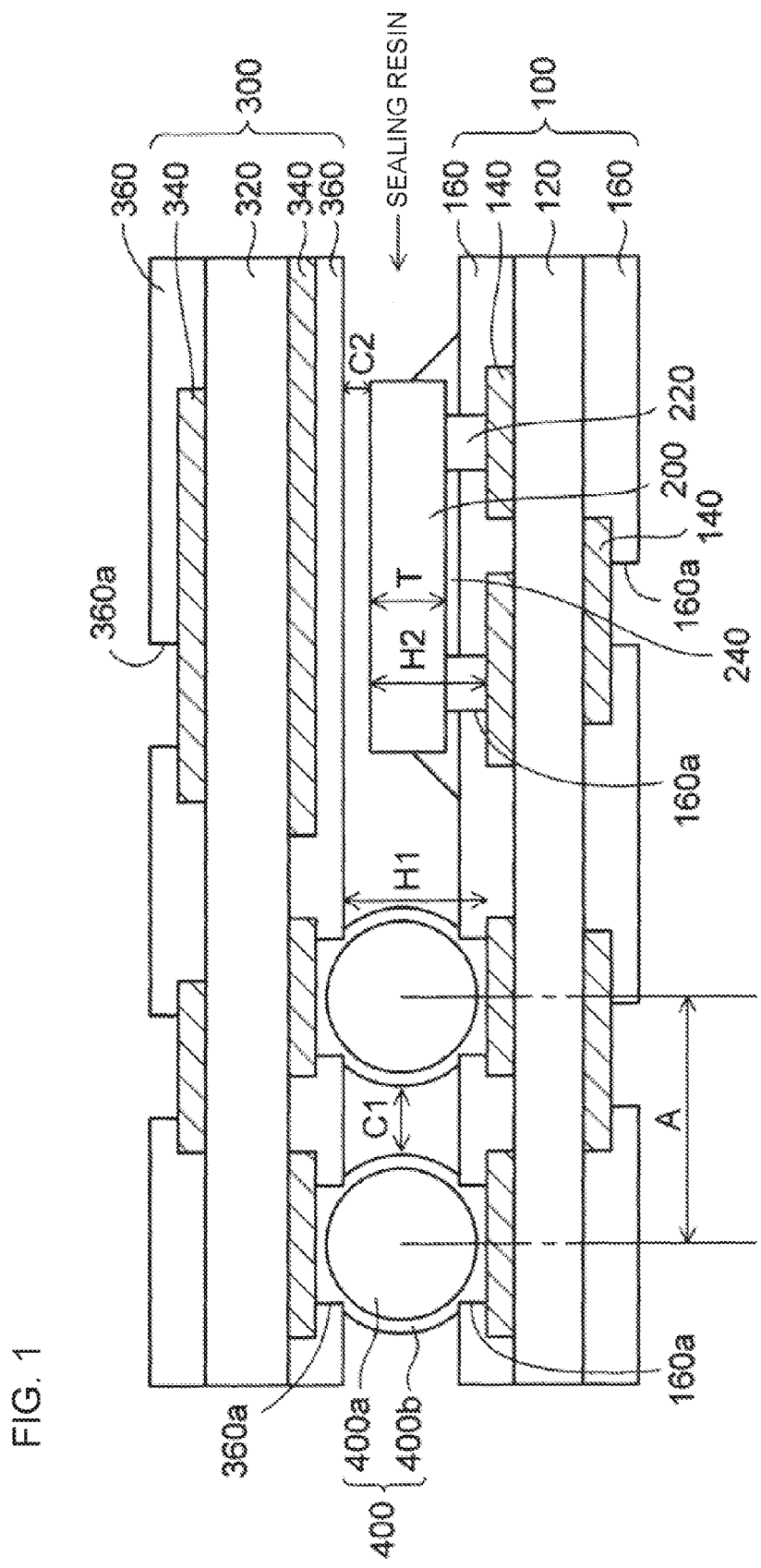
FIG. 1 is a sectional view for explaining a problem of an electronic component device according to a preliminary matter.

As shown in FIG. 1, an electronic component device according to the preliminary matter includes a lower wiring substrate 100 provided in the bottom. In the lower wiring substrate 100, wiring layers 140 are formed respectively on opposite surface sides of an insulating substrate 120. The wiring layers 140 on the opposite surface sides are connected to each other by through conductors (not shown) formed in the insulating substrate 120.

In addition, solder resist layers 160 are formed respectively on the opposite surface sides of the insulating substrate 120 so that opening portions 160a formed in the solder resist layers 160 are provided on connection portions of the wiring layers 140.

Terminals 220 of a semiconductor chip 200 are flip-chip connected to the wiring layer 140 on the upper surface side of the lower wiring substrate 100. A space under the semiconductor chip 200 is filled with an underfill resin 240.

Further, an upper wiring substrate 300 is disposed above the lower wiring substrate 100 and the semiconductor chip 200 through conductive balls 400. Each of the conductive balls 400 is formed such that an outer surface of a copper ball 400a is covered with a solder layer 400b.

In the upper wiring substrate 300, wiring layers 340 are formed respectively on opposite surface sides of an insulating substrate 320. The wiring layers 340 on the opposite surface sides are connected to each other by through conductors (not shown) formed in the insulating substrate 320.

In addition, solder resist layers 360 are formed respectively on the opposite surface sides of the insulating substrate 320 so that opening portions 360a formed in the solder resist layers 360 are provided on connection portions of the wiring layers 340.

The wiring layer 140 on the upper surface side of the lower wiring substrate 100 and the wiring layer 340 on the lower surface side of the upper wiring substrate 300 are electrically connected to each other through the conductive balls 400.

In this manner, the semiconductor chip 200 is received in a region between the lower wiring substrate 100 and the upper wiring substrate 300.

In recent years, the signal amount has increased with the increase in performance and integration of the semiconductor chip 200. Therefore, it is necessary to narrow the pitch of the respective connection portions of the lower wiring substrate 100 and the upper wiring substrate 300 to thereby increase the number of connection paths between the upper wiring substrate 300 and the lower wiring substrate 100.

In order to meet the requirement, in the structure of the electronic component device in FIG. 1, the diameter of each of the conductive balls 400 must be reduced and the number of conductive balls 400 must be increased so as to narrow the pitch of the connection portions.

The case of a design rule for setting the disposition pitch A of the conductive balls 400 at 200 μm will be examined here. In this case, the diameter of each conductive ball 400 including the solder layer 400b is set at 160 μm and an interval C1 between adjacent ones of the conductive balls 400 is set at 40 μm in order to arrange the conductive balls 400 with a margin large enough not to cause any short-circuiting between adjacent conductive balls 400.

Practically, the solder layers 400b of the conductive balls 400 are melted while pressed between the lower wiring substrate 100 and the upper wiring substrate 300. Consequently, the substantial diameter of each of the conductive balls 400 in an up/down direction is about 130 μm.

Therefore, when the thickness of the solder resist layer 360 on the wiring layer 340 of the upper wiring substrate 300 is 15 μm, a height H1 between an upper surface of the wiring layer 140 of the lower wiring substrate 100 and a lower surface of the solder resist layer 360 of the upper wiring substrate 300 is 115 μm (130 μm−15 μm).

In addition, a thickness T of the semiconductor chip 200 is 75 μm and a height of each of the terminals 220 of the semiconductor chip 200 is 25 μm. In this case, a height H2 of the semiconductor chip 200 from the upper surface of the wiring layer 140 of the lower wiring substrate 100 is 100 μm (75 μm+25 μm).

In the aforementioned design case, an interval C2 between an upper surface of the semiconductor chip 200 and the lower surface of the solder resist layer 360 of the upper wiring substrate 300 is very narrow to be 15 μm (115 μm−100 μm).

Therefore, when a sealing resin is poured into a space between the lower wiring substrate 100 and the upper wiring substrate 300 to seal the semiconductor chip 200, there is a likelihood that the interval C2 above the semiconductor chip 200 is too narrow to fill the space with the sealing resin well.

As a measure to cope with this problem, reduction in the thickness of the semiconductor chip 200 may be considered. However, there is a limit on the reduction in the thickness of the semiconductor chip 200 and it is very difficult to reduce the thickness beyond the limit. In addition, in a method for increasing the diameter of each of the conductive balls 400 to thereby widen the interval C2, since the pitch of conductive balls 400 has been determined, short-circuiting is apt to occur between adjacent ones of the conductive balls 400 to thereby lower the manufacturing yield of the electronic component device.

The aforementioned problem can be solved by an electronic component device and a method for manufacturing the same according to an embodiment which will be described as follows.

Embodiment

Figure 23:
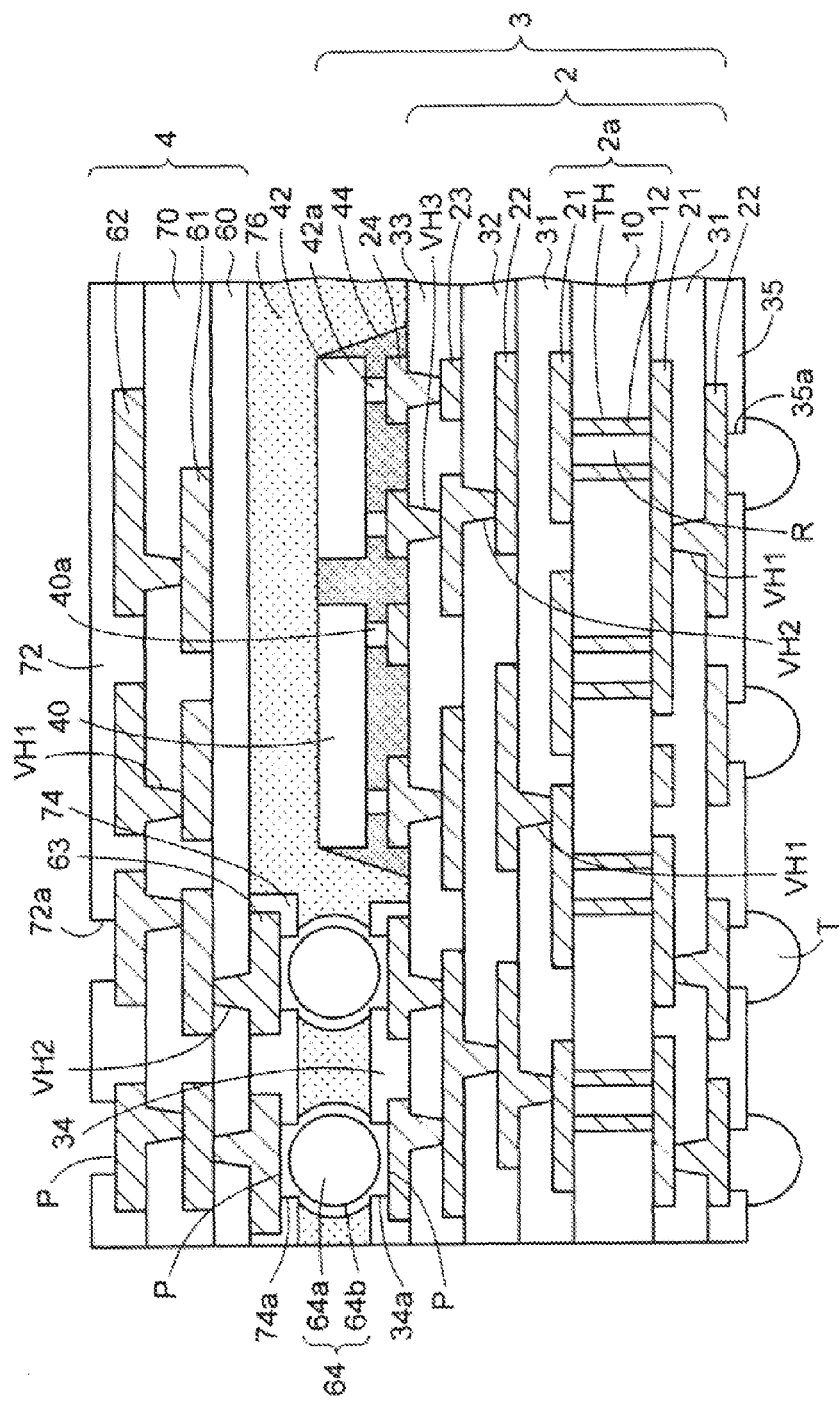
FIG. 23 is a sectional view showing a part of the electronic component device according to the embodiment.
Figure 24:
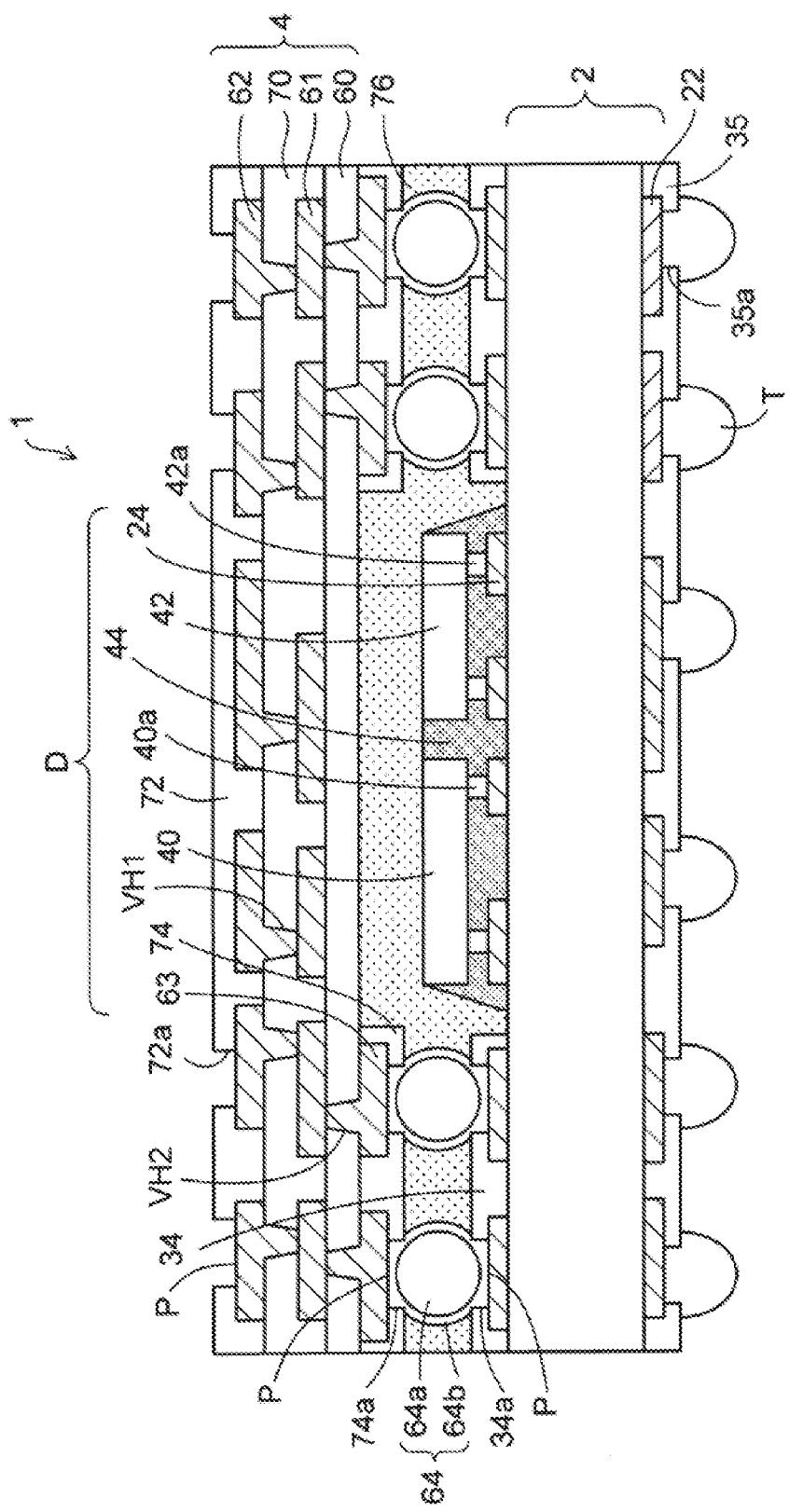
FIG. 24 is a sectional view showing an entire state of the electronic component device according to the embodiment.
Figure 25:
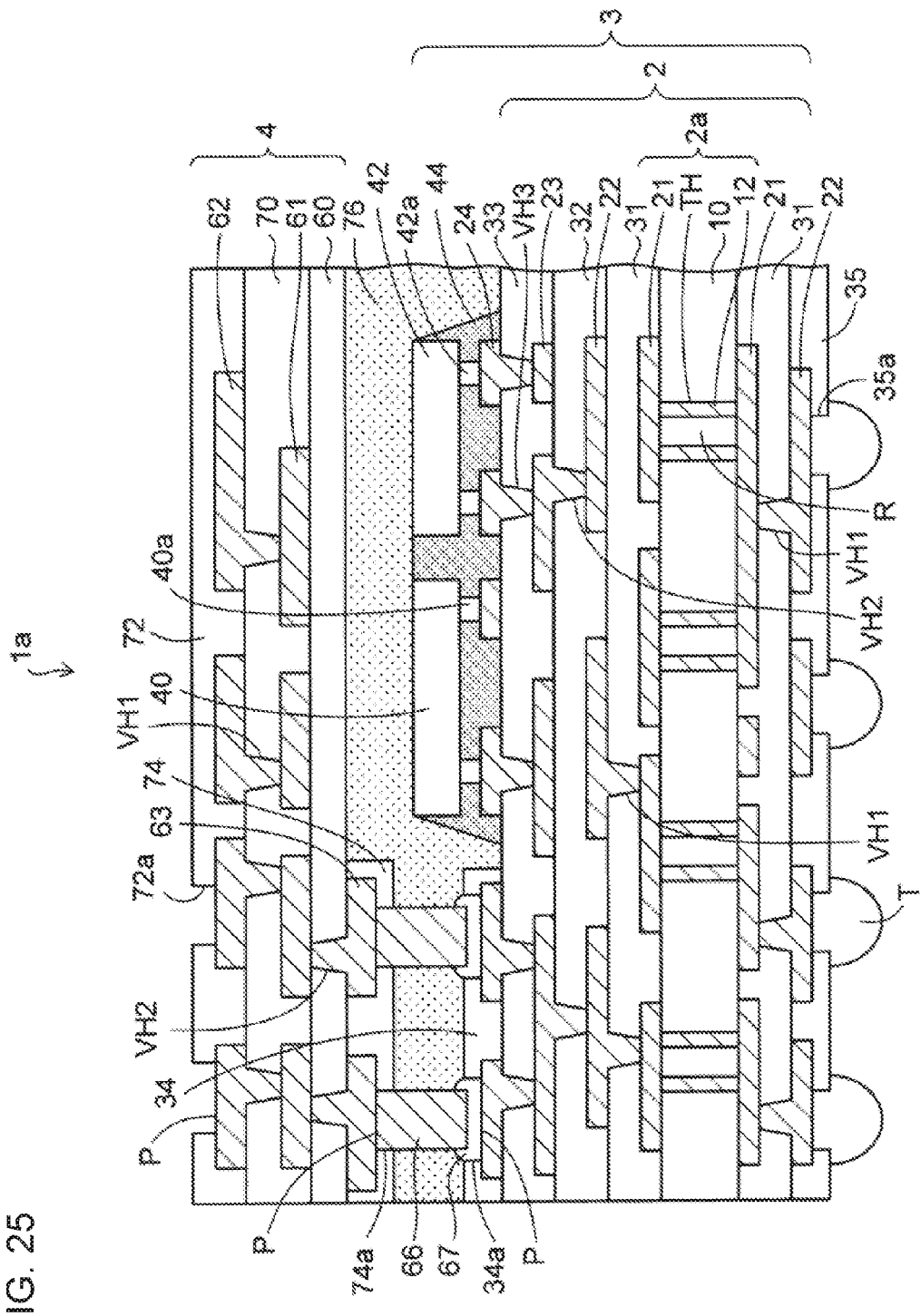
FIG. 25 is a sectional view showing an electronic component device according to a modification of the embodiment.

FIGS. 2A and 2B, FIGS. 3A and 3B, FIG. 4, FIGS. 5A and 5B, FIGS. 6 to 9, FIGS. 10A and 10B, FIGS. 11 to 13, FIGS. 14A and 14B, FIGS. 15 and 16, FIGS. 17A and 17B, FIGS. 18A and 18B, and FIGS. 19 to 22 are views for explaining the method for manufacturing the electronic component device according to the embodiment. FIGS. 23 to 25 are views showing the electronic component device according to the embodiment. The structure of the electronic component device will be described below while the method for manufacturing the electronic component device is described.

In the method for manufacturing the electronic component device according to the embodiment, a lower wiring substrate and an upper wiring substrate are used. In the beginning, a method for manufacturing the lower wiring substrate will be described. First, a core wiring substrate 2a shown in FIG. 2A is prepared. The core wiring substrate 2a includes a core substrate 10 made of an insulating material such as a glass epoxy resin.

Wiring layers 21 made of copper etc. are formed respectively on opposite surface sides of the core substrate 10. Through holes TH are formed to pierce the core substrate 10 in a thickness direction. A through hole plating layer 12 is formed on inner walls of the through holes TH. The remaining openings of the through holes are filled with a resin substance R. The wiring layers 21 on the opposite surface sides of the core substrate 10 are connected to each other through the through hole plating layer 12.

Alternatively, a structure in which the through holes TH in the core substrate 10 may be entirely filled with through conductors by plating may be used.

Next, as shown in FIG. 2B, unhardened resin films are pasted on the opposite surface sides of the core substrate 10 and subjected to heat treatment to be hardened so that insulating layers 31 are formed respectively. The insulating layers 31 are made of an epoxy resin or a polyimide resin, etc. The insulating layers 31 may be formed by applying a liquid resin.

When the insulating layers 31 on the opposite surface sides are then processed by a laser, via holes VH1 are formed in the insulating layers 31 to respectively reach connection portions of the wiring layers 21 on the opposite surface sides.

Figure 3A:
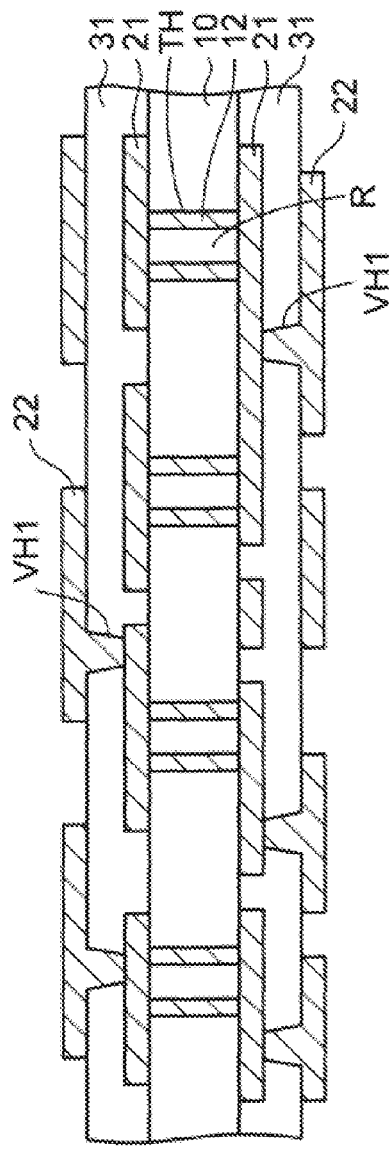
FIGS. 3A and 3B are sectional views (part 2) showing the method for manufacturing the lower wiring substrate for use in the electronic component device according to the embodiment.

Successively, as shown in FIG. 3A, wiring layers 22 are formed respectively on the insulating layers 31 on the opposite surface sides to be connected to the wiring layers 21 through via conductors inside the via holes VH1.

The wiring layers 22 are formed by a semi-additive method. Specifically, seed layers (not shown) made of copper etc. are formed on the insulating layers 31 and the inner surfaces of the via holes VH1 by an electroless plating or sputtering method. Next, plating resist layers (not shown) including opening portions provided in sites where the wiring layers 22 should be disposed are formed.

Successively, metal plating layers made of copper etc. are formed in the opening portions of the plating resist layers by electrolytic plating using the seed layers as plating power feed passages. Then, the plating resist layers are removed.

Further, the seed layers are removed by wet wetting with the metal plating layers as masks. Thus, the wiring layers 22 are formed of the seed layers and the metal plating layers.

Figure 3B:
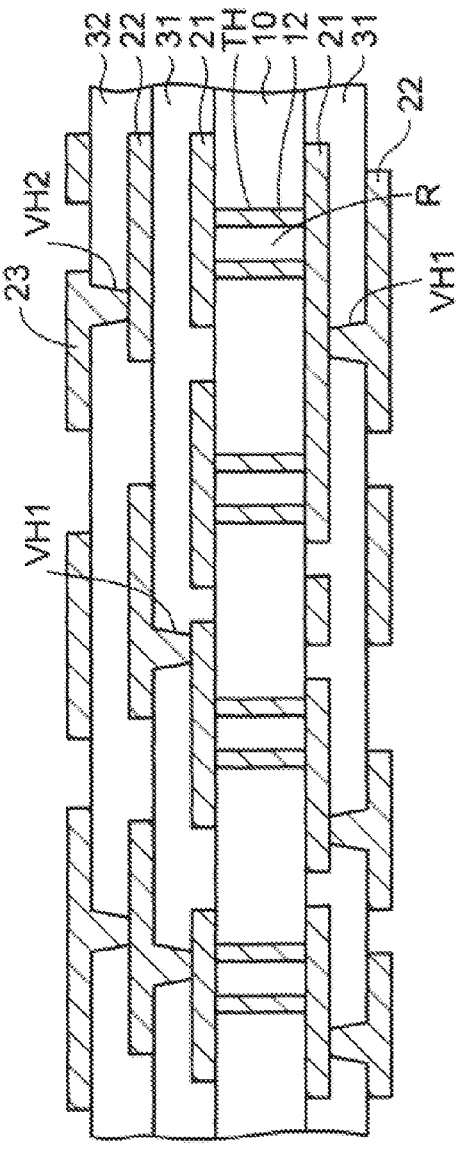

Next, as shown in FIG. 3B, an insulating layer 32 is formed on the insulating layer 31 on the upper surface side of the core substrate 10 by a similar method to the aforementioned step of FIG. 2B so that via holes VH2 formed in the insulating layer 32 are disposed on connection portions of the wiring layer 22.

Further, also as shown in FIG. 3B, a wiring layer 23 is formed on the insulating layer 32 by a similar method to the aforementioned step of FIG. 3A so as to be connected to the wiring layer 22 through via conductors inside the via holes VH2.

Figure 4:
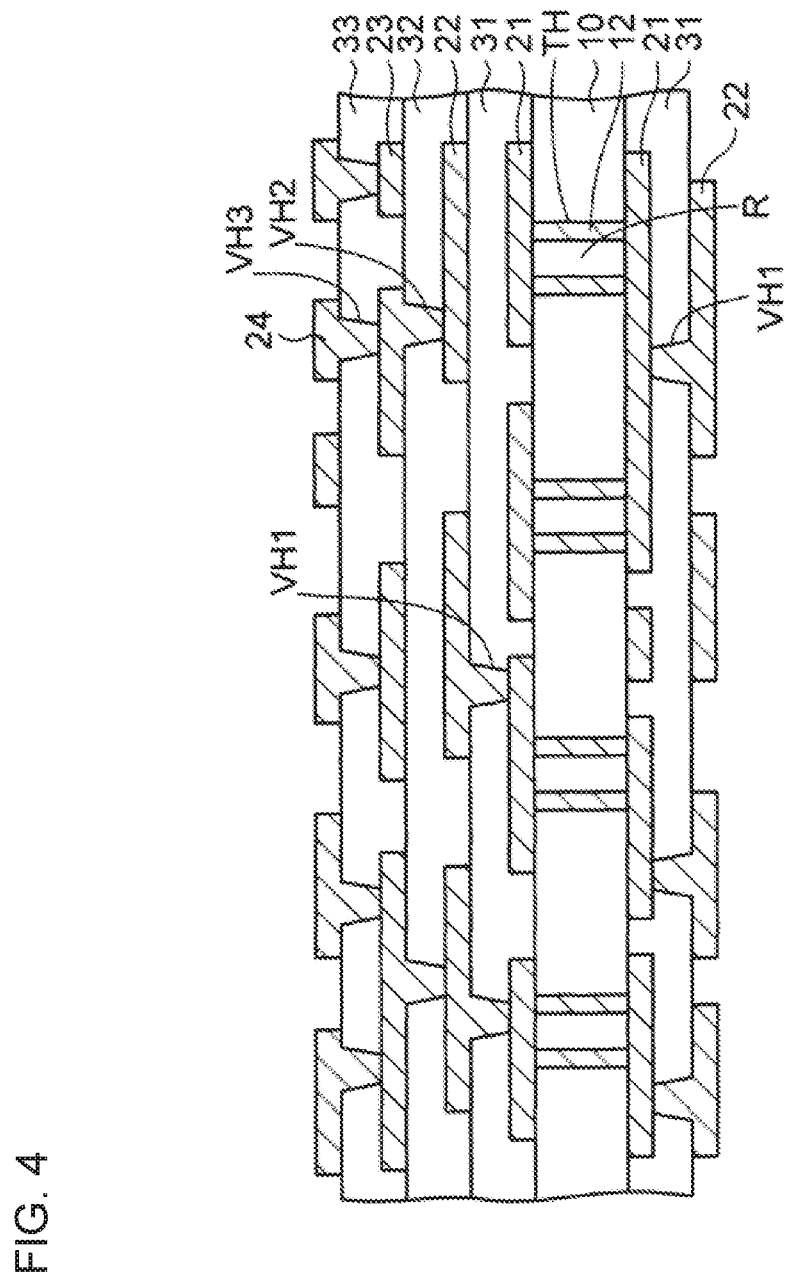
FIG. 4 is a sectional view (part 3) showing the method for manufacturing the lower wiring substrate for use in the electronic component device according to the embodiment.

Successively, as shown in FIG. 4, an insulating layer 33 is formed on the insulating layer 32 on the upper surface side of the core substrate 10 by repeating the aforementioned step of FIG. 3B so that via holes VH3 formed in the insulating layer 33 are disposed on connection portions of the wiring layer 23. Further, also as shown in FIG. 4, a wiring layer 24 is formed on the insulating layer 33 so as to be connected to the wiring layer 23 through via conductors inside the via holes VH3.

Figures 5A, 5B:
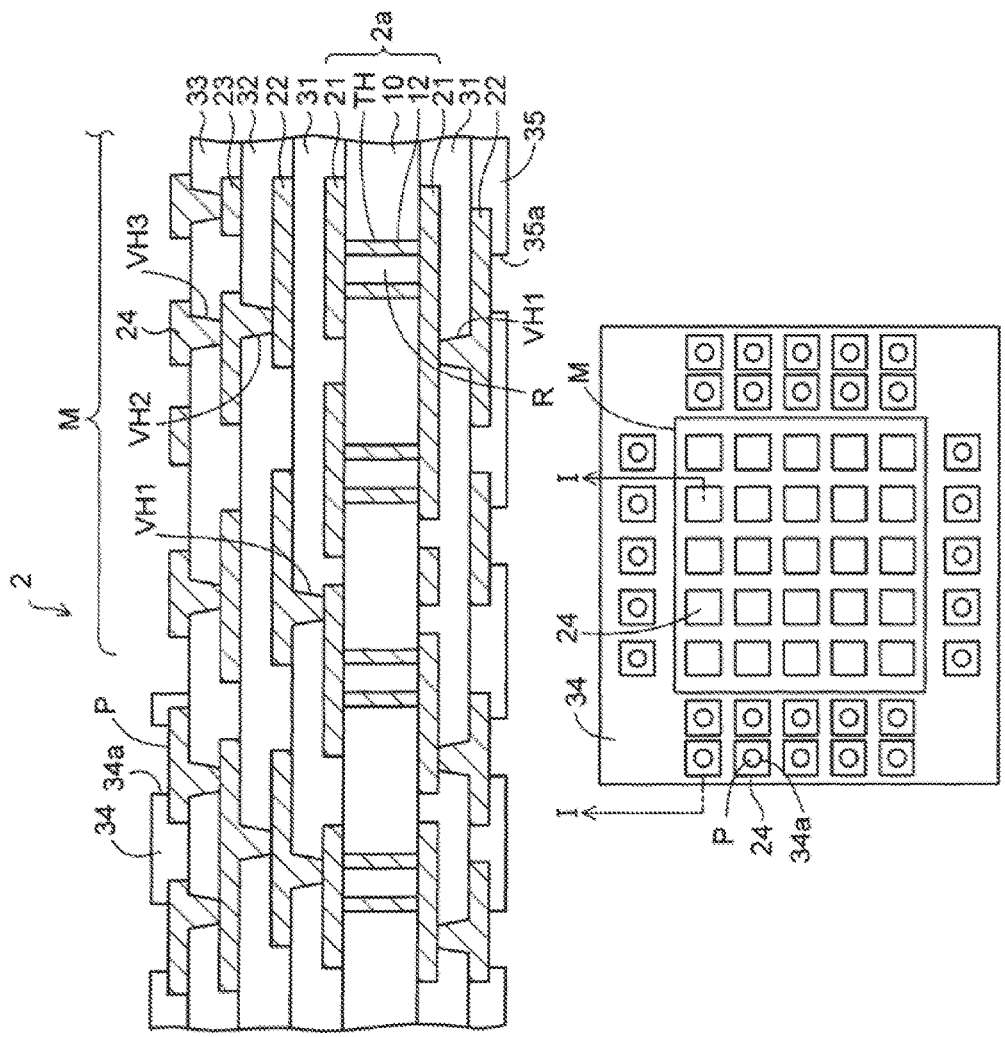
FIGS. 5A and 5B are a sectional view and a plan view showing the lower wiring substrate for use in the electronic component device according to the embodiment.

Next, as shown in FIG. 5A, a solder resist layer 34 is formed on the insulating layer 33 on the upper surface side of the core substrate 10 so that opening portions 34a formed in the solder resist layer 34 are disposed on pads P of the wiring layer 24. Further, a solder resist layer 35 is formed on the insulating layer 31 on the lower surface side of the core substrate 10 so that opening portions 35a formed in the solder resist layer 35 are disposed on connection portions of the wiring layer 22.

A component mounting region M in which electronic components should be mounted on the upper surface side of the core substrate 10 is defined. Although the solder resist layer 34 is not formed in the component mounting region M in the example of FIG. 5A, the solder resist layer may be also disposed in the component mounting region M.

When the solder resist layer 34 is not provided in the component mounting region M, the mounting height of each of the semiconductor chips can be reduced. Accordingly, an interval between the upper surface of the semiconductor chip and a lower surface of an upper wiring substrate 4 which will be described later can be secured more widely.

In the aforementioned manner, the lower wiring substrate 2 for use in the electronic component device according to the embodiment can be manufactured, as shown in FIG. 5A.

The lower wiring substrate 2 is a substrate for obtaining multiple pieces. A plurality of product regions each including the component mounting region M are defined in the lower wiring substrate 2. A part of one product region of the lower wiring substrate 2 is partially shown in FIG. 5A.

An entire state of one product region on the upper surface side of the lower wiring substrate 2 is schematically shown in a reduced plan view of FIG. 5B. The sectional view of FIG. 5A corresponds to a section taken along a line I-I of the reduced plan view of FIG. 5B.

As shown in FIG. 5A, the aforementioned core wiring substrate 2a described in FIG. 2A is internally provided in the lower wiring substrate 2 for use in the electronic component device according to the embodiment. The insulating layers 31 are formed respectively on the opposite surface sides of the core wiring substrate 2a so that the via holes VH1 formed in the insulating layers 31 are disposed on the connection portions of the wiring layers 21.

The wiring layers 22 are formed respectively on the insulating layers 31 on the opposite surface sides to be connected to the wiring layers 21 through the via conductors inside the via holes VH1.

The insulating layer 32 is formed on the insulating layer 31 on the upper surface side of the core wiring substrate 2a so that the via holes VH2 formed in the insulating layer 32 are disposed on the connection portions of the wiring layer 22. Further, the wiring layer 23 is formed on the insulating layer 32 to be electrically connected to the wiring layer 22 through the via conductors inside the via holes VH2.

In addition, the insulating layer 33 is similarly formed on the insulating layer 32 so that the via holes VH3 formed in the insulating layer 33 are disposed on the connection portions of the wiring layer 23. Moreover, the wiring layer 24 is similarly formed on the insulating layer 33 to be electrically connected to the wiring layer 23 through the via conductors inside the via holes VH3.

In addition, the solder resist layer 34 is formed on the insulating layer 33 so that the opening portions 34a formed in the solder resist layer 34 are disposed on the pads P of the wiring layer 24. Further, the solder resist layer 35 is formed on the insulating layer 31 on the lower surface side of the core wiring substrate 2a so that the opening portions 35a formed in the solder resist layer 35 are disposed on the connection portions of the wiring layer 22.

When the reduced plan view of FIG. 5B is referred to additionally, the pads P of the wiring layer 24 are disposed in a circumferential edge portion of the product region. In addition, the solder resist layer 34 is formed in the circumferential edge portion of the product region so that the opening portions 34a formed in the solder resist layer 34 are disposed on the pads P. The component mounting region M is disposed in a central portion of the product region. The wiring layer 24 is depicted in perspective in the reduced plan view of FIG. 5B.

Figure 6:
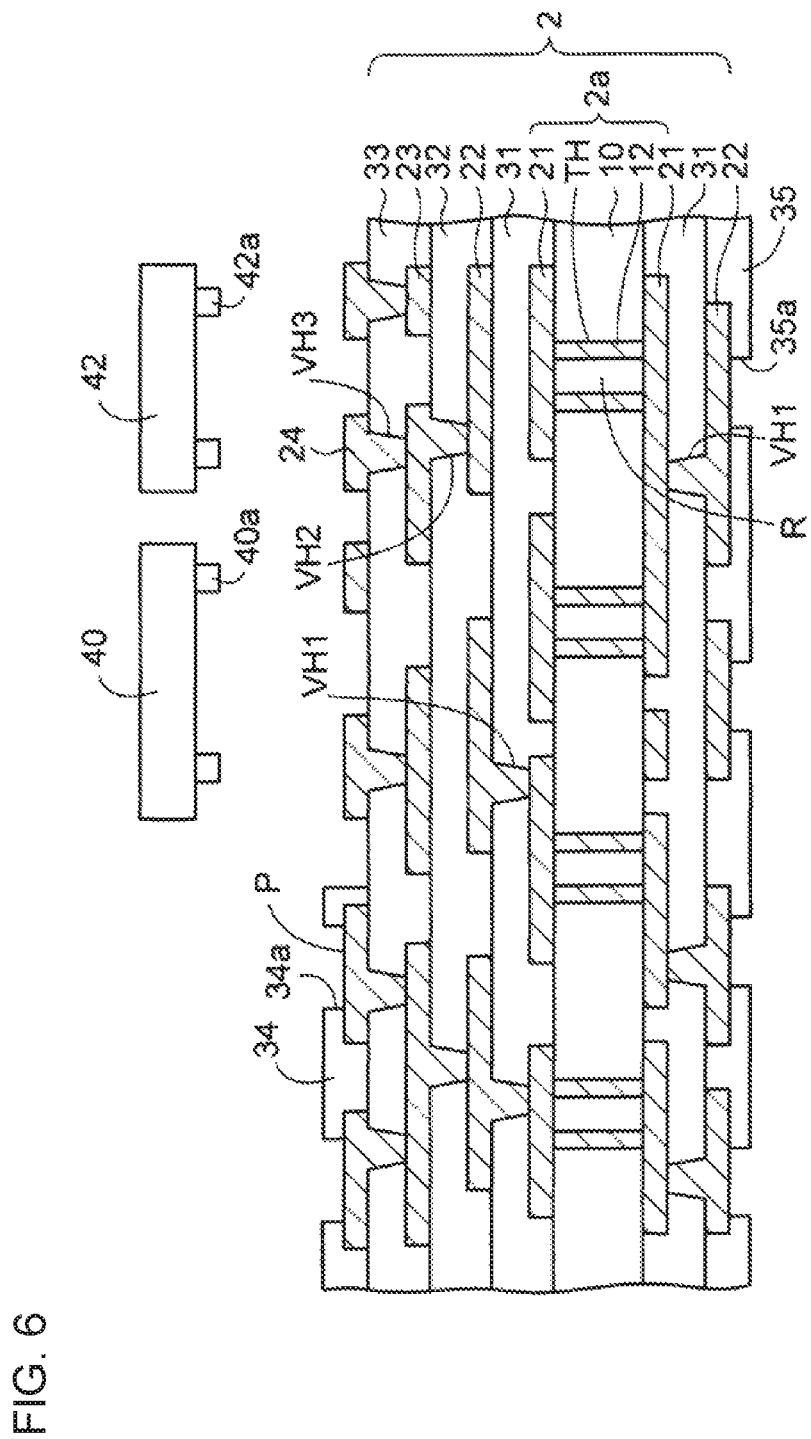
FIG. 6 is a sectional view showing a state in which semiconductor chips are mounted on the lower wiring substrate in FIGS. 5A and 5B.

Next, a method for mounting electronic components on the lower wiring substrate 2 in FIG. 5A will be described. As shown in FIG. 6, a semiconductor chip 40 and a semiconductor chip 42 are prepared. The semiconductor chip 40 is provided with bump-like terminals 40a on an element formation surface side. In addition, the semiconductor chip 42 is similarly provided with bump-like terminals 42a on an element formation surface side.

For example, the respective terminals 40a, 42a of the semiconductor chip 40, 42 consist of metal posts made of copper etc. Solders are formed on front ends of the terminals 40a, 42a. The semiconductor chip 40, 42 is simply an example of the electronic component. For example, the semiconductor chip 40, 42 may be a CPU chip or a memory chip using a silicon substrate.

Although a plurality of semiconductor chips are mounted in the example, one semiconductor chip may be mounted alternatively.

Figure 7:
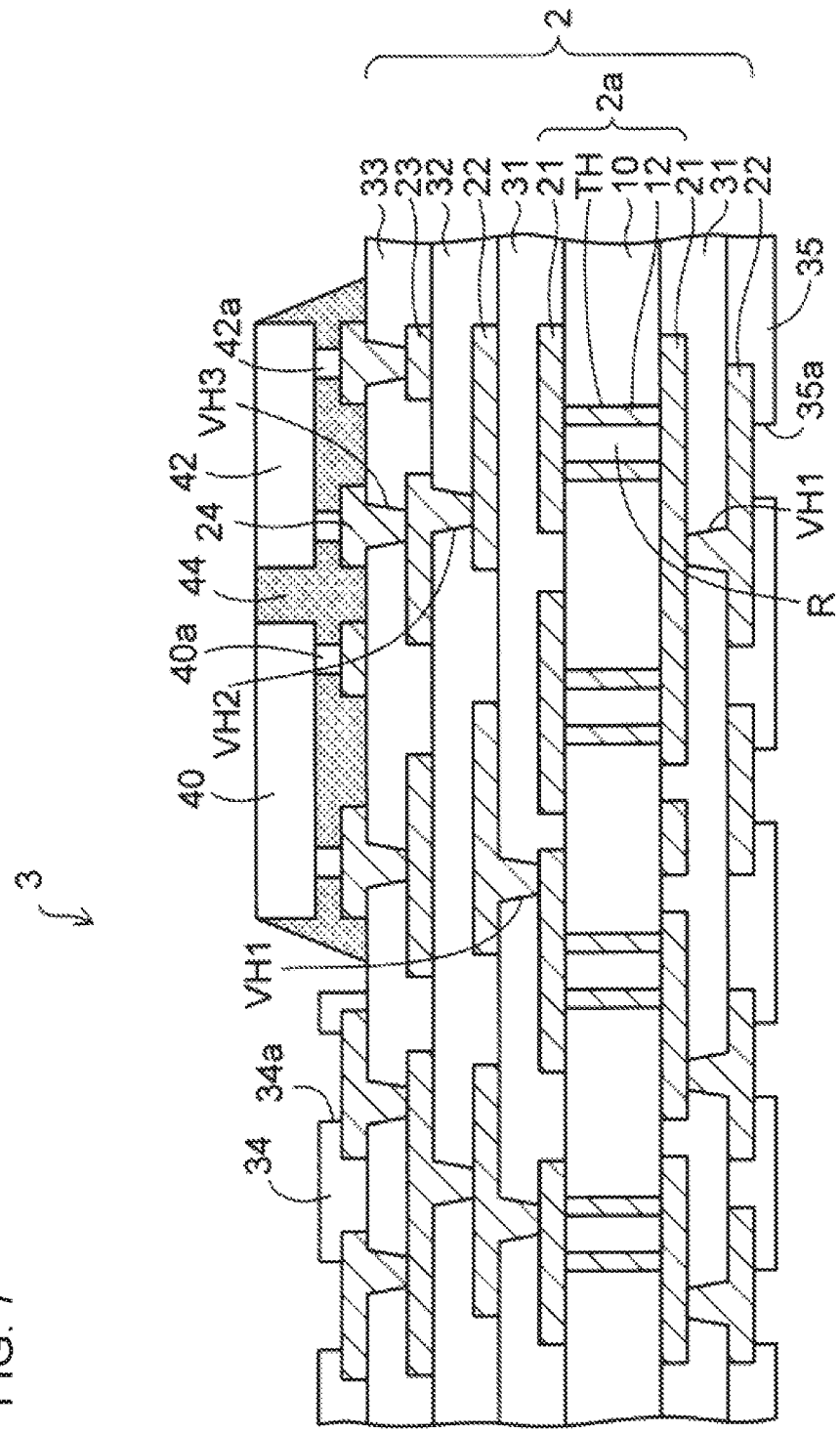
FIG. 7 is a sectional view showing a semiconductor module in which the semiconductor chips have been mounted on the lower wiring substrate in FIGS. 5A and 5B.

As shown in FIG. 7, the terminals 40a of the semiconductor chip 40 are flip-chip connected to the wiring layer 24 in the component mounting region M of the lower wiring substrate 2 by solders. In addition, the terminals 42a of the semiconductor chip 42 are similarly flip-chip connected to the wiring layer 24 in the component mounting region M of the lower wiring substrate 2 by solders.

Further, also as shown in FIG. 7, a gap between the semiconductor chips 40 and 42 and the lower wiring substrate 2 is filled with an underfill resin 44 such as an epoxy resin. The underfill resin 44 is formed to cover respective side surfaces of the semiconductor chips 40 and 42.

Alternatively, a resin material may be disposed in the component mounting region M of the lower wiring substrate 2 so that the respective terminals 40a and 42a of the semiconductor chips 40 and 42 can be flip-chip connected to the lower wiring substrate 2 through the resin material. In this case, the resin material serves as the underfill resin.

In addition, various electronic components selected from capacitor elements, resistance elements, inductor elements etc. can be mounted in place of the semiconductor chips.

In the aforementioned manner, a semiconductor module 3 in which the semiconductor chips 40 and 42 are mounted on the lower wiring substrate 2 can be obtained, as shown in FIG. 7.

Figure 8:
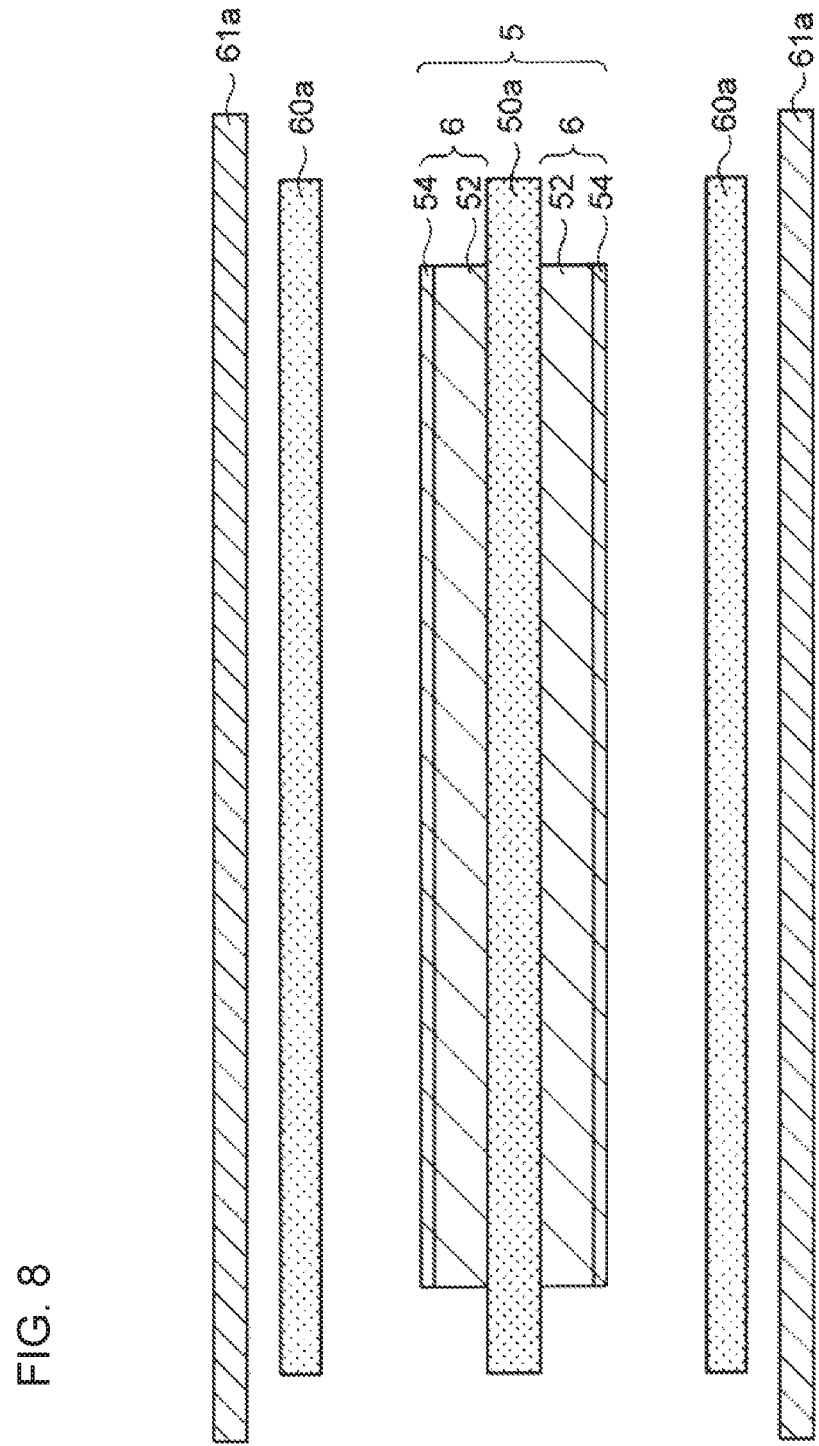
FIG. 8 is a sectional view (part 1) showing a method for manufacturing an upper wiring substrate for use in the electronic component device according to the embodiment.

Next, a method for manufacturing the upper wiring substrate for use in the electronic component device according to the embodiment will be described. First, a support 5 shown in FIG. 8 is prepared. The support 5 is formed of a prepreg 50a and carrier-including copper foils 6 bonded respectively on opposite surfaces of the prepreg 50a.

Each carrier-including copper foil 6 is formed of a copper foil 52 functioning as a carrier, and a copper foil 54 shaped like a thin film. The prepreg 50a is a semi-hardened composite material formed by impregnating reinforcing fiber such as glass fiber, carbon fiber or aramid fiber with a resin material such as an epoxy resin or a polyimide resin.

For example, the thickness of the prepreg 50a of the support 5 is 30 μm to 500 μm. In addition, in the carrier-including copper foil 6, the thickness of the copper foil 52 is 12 μm to 70 μm, and the thickness of the copper foil 54 is 2 μm to 5 μm.

A release agent (not shown) is formed between the copper foil 52 and the copper foil 54 of the carrier-including copper foil 6 so that the copper foil 52 and the copper foil 54 can be released easily from each other at an interface between the both. A silicon-based release agent, a fluorine-based release agent, or any release agent in which particles containing a metal component are mixed into components of these release agents, etc. is used as the release agent.

Further, prepregs 60a and copper foils 61a are prepared. Copper foil-including prepregs in each of which a copper foil 61a is bonded on one surface of a prepreg 60a may be prepared alternatively. Each of areas of the prepreg 50a of the support 5 and the prepregs 61a is set to be a size larger than the area of the carrier-including copper foil 6. The prepreg 60a is made of the same material as that of the prepreg 50a of the support 5.

The prepregs 60a are provided respectively on the upper and lower copper foils 54 of the support 5. Then, the copper foils 61a are provided respectively on outer surfaces of the upper and lower prepregs 60a. Further, the prepregs 60a and the copper foils 61a are pasted while pressed in a heated state.

Thus, as shown in FIG. 9, the prepreg 50a of the support 5 and the prepregs 60a on the opposite surface sides are hardened in a melted state to thereby serve as prepreg insulating layers 50 and 60.

When the parts of the prepregs 50a and 60a on the outer sides of the carrier-including copper foils 6 are melted on this occasion, outer circumferential side surfaces of the carrier-including copper foils 6 are covered with the prepreg insulating layers 50 and 60.

When release interfaces of the carrier-including copper foils 6 are exposed, there is a case where peeling off may occur, for example, due to a chemical liquid entering the release interfaces of the carrier-including copper foils 6 in a subsequent manufacturing step.

However, in the embodiment, the release interfaces of the carrier-including copper foils 6 are protected by the prepreg insulating layers 50 and 60. Accordingly, peeling off can be prevented from occurring at the interfaces between the copper foils 52 and the copper foils 54 in a manufacturing step prior to execution of release.

Successively, as shown in FIG. 10A, overhangs in the circumferential edge portions of the structure in FIG. 9 are cut so that side surfaces can be trimmed into straight shapes. Further, also as shown in FIG. 10A, resist layers 14 are patterned respectively on the copper foils 61a on the opposite surface sides through photolithography. Further, the copper foils 61a on the opposite surface sides are wet-etched with the resist layers 14 as masks. Then, the resist layers 14 are removed.

Thus, as shown in FIG. 10B, the copper foils 61a on the opposite surface sides are patterned so that wiring layers 61 are formed respectively on the opposite surface sides.

Figure 11:
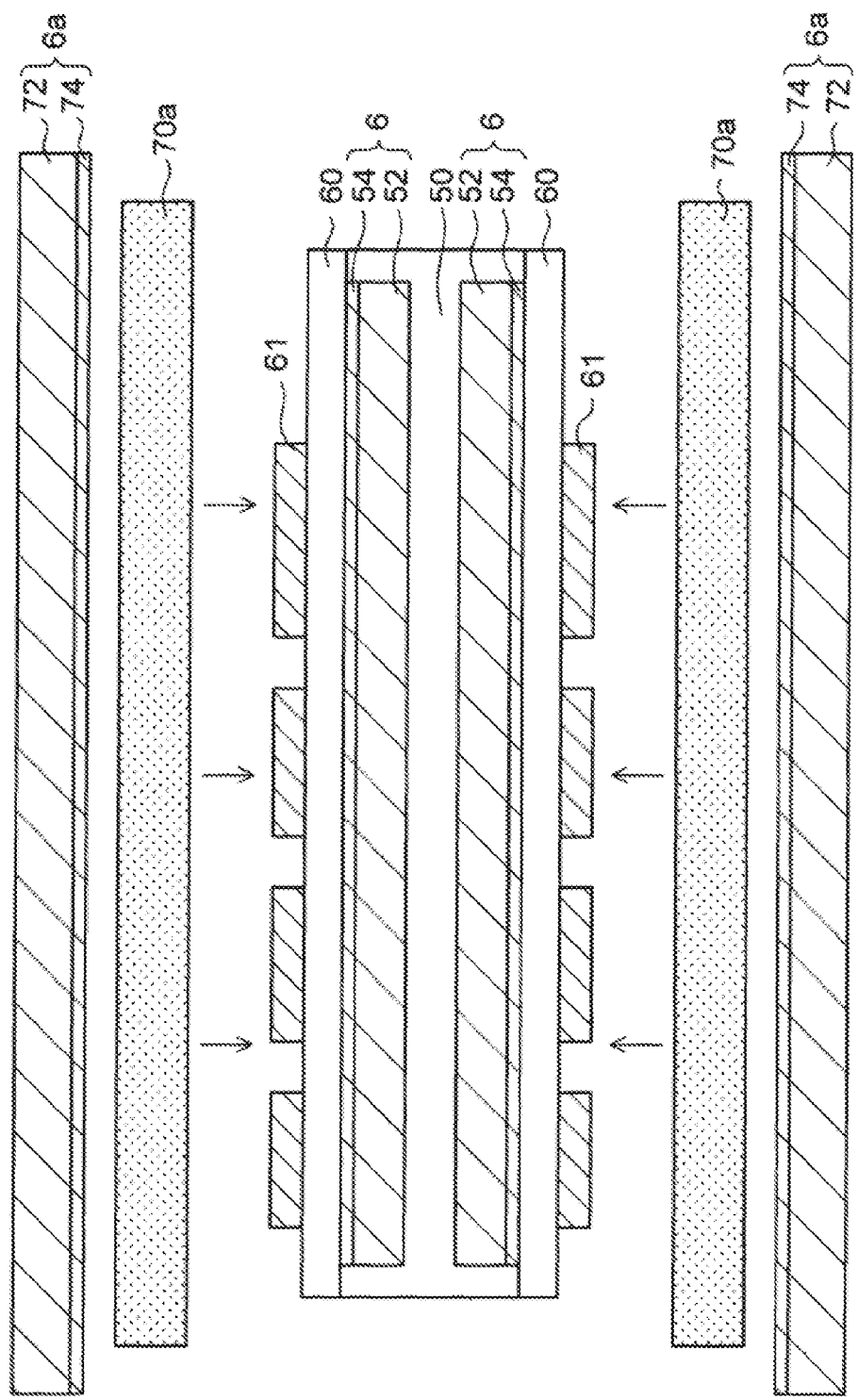
FIG. 11 is a sectional view (part 4) showing the method for manufacturing the upper wiring substrate for use in the electronic component device according to the embodiment.

Next, as shown in FIG. 11, carrier-including copper foils 6a and prepregs 70a are prepared. The carrier-including copper foils 6a are formed of copper foils 72 functioning as carriers, and copper foils 74 shaped like thin films. The prepregs 70a are made of a similar material to that of the prepreg 50a of the support 5. Layered base materials in each of which the carrier-including copper foil 6a and the prepreg 70a are bonded may be used alternatively.

Similarly to the aforementioned carrier-including copper foils 6 of the support 5 described in FIG. 8, the copper foils 72 and the copper foils 74 in the carrier-including copper foils 6a can be also released easily from each other at interfaces between the both.

The prepregs 70a are provided respectively on upper and lower surfaces of the aforementioned structure in FIG. 10B. Then, surfaces of the copper foils 74 of the carrier-including copper foils 6a are provided respectively on outer surfaces of the upper and lower prepregs 70a. Further, the prepregs 70a and the carrier-including copper foils 6a are pasted while pressed in a heated state.

Figure 12:
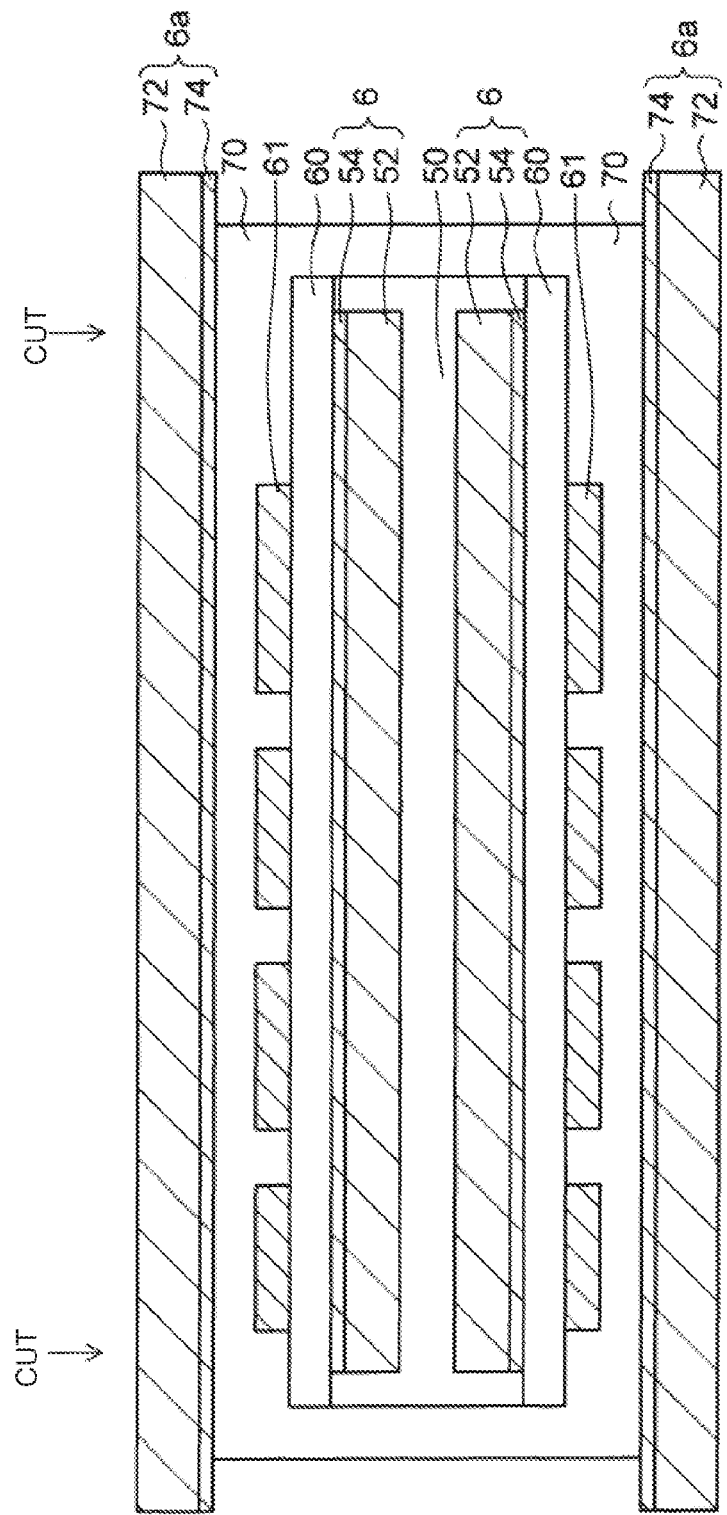
FIG. 12 is a sectional view (part 5) showing the method for manufacturing the upper wiring substrate for use in the electronic component device according to the embodiment.

Thus, as shown in FIG. 12, the prepregs 70a are hardened to serve as prepreg insulating layers 70. The wiring layers 61 on the opposite surface sides of the support 5 are embedded in the prepreg insulating layers 70.

Further, also as shown in FIG. 12, the structure in FIG. 12 is cut from the upper surface up to the lower surface at places corresponding to the circumferential edge portions of the copper foils 52 and the copper foils 54 of the support 5 (FIG. 8). Thus, the respective release interfaces of the carrier-including copper foils 6a on the upper and lower sides and the respective release interfaces of the carrier-including copper foils 6 on the opposite surface sides of the support 5 (FIG. 8) are exposed.

Figure 13:
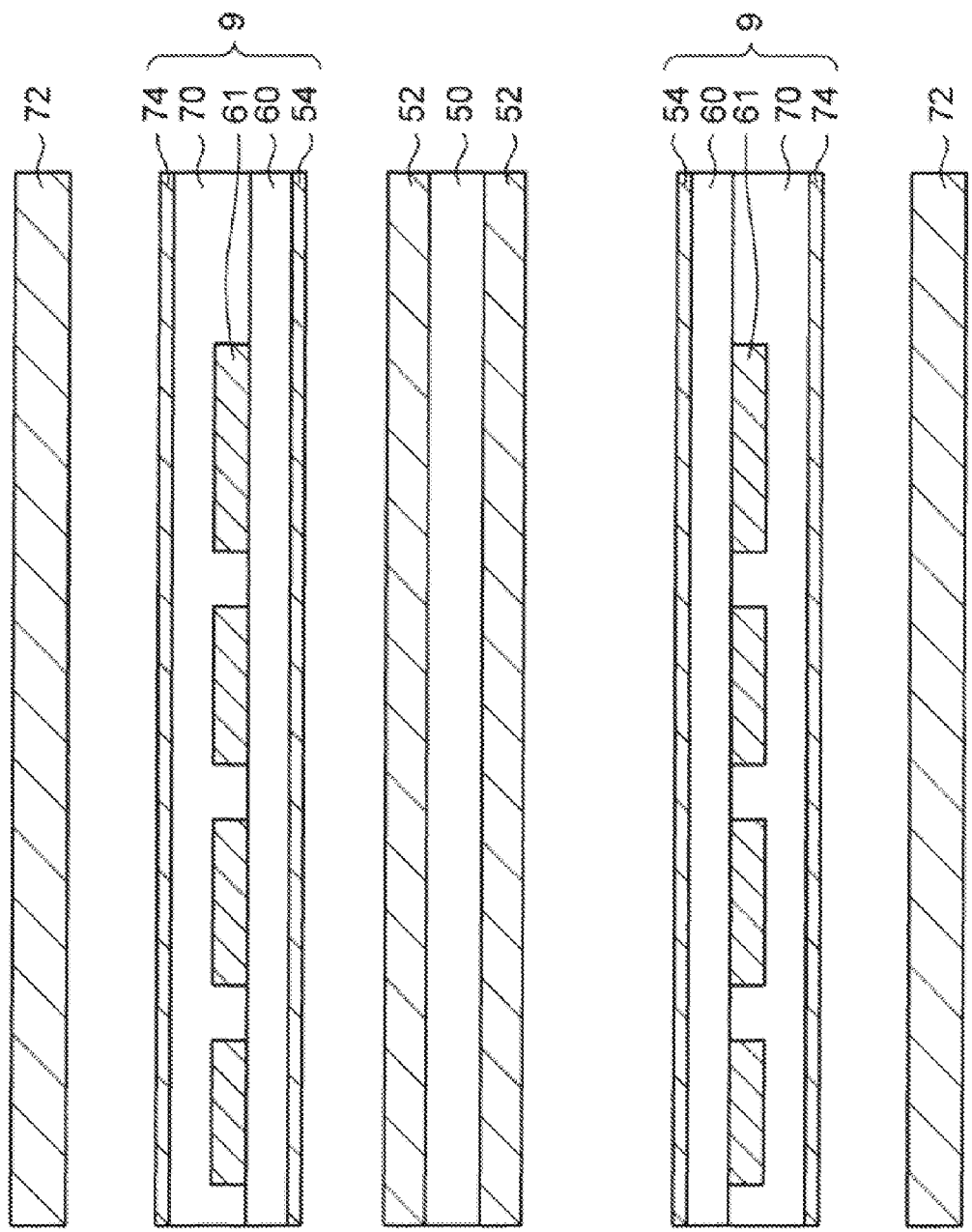
FIG. 13 is a sectional view (part 6) showing the method for manufacturing the upper wiring substrate for use in the electronic component device according to the embodiment.

As shown in FIG. 13, the copper foils 72 and the copper foils 74 on the upper and lower sides are released at interfaces between the both so that the copper foils 72 are separated from the copper foils 74 respectively. Further, the copper foils 54 and the copper foils 52 on the opposite surface sides of the support 5 (FIG. 8) are released from each other at interfaces between the both so that the copper foils 52 are separated from the copper foils 54 respectively.

Thus, wiring members 9 can be obtained respectively from the opposite surface sides of the support 5 (FIG. 8). The wiring member 9 obtained from the upper of the support 5 is formed such that the copper foil 54, the prepreg insulating layer 60, the wiring layer 61, the prepreg insulating layer 70, and the copper foil 74 are provided in the named order from bottom to top. The wiring member 9 obtained from the lower of the support 5 also has one and the same structure when it is turned upside down.

Figure 14A:
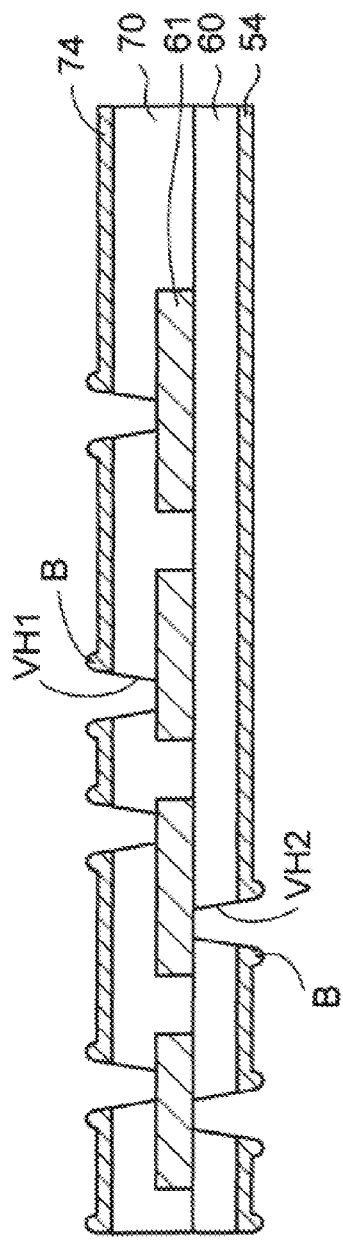
FIGS. 14A and 14B are sectional views (part 7) showing the method for manufacturing the upper wiring substrate for use in the electronic component device according to the embodiment.

The wiring member 9 obtained from the upper of the support 5 will be used in the following description. As shown in FIG. 14A, the copper foil 74 and the prepreg insulating layer 70 on the upper surface side are processed by a laser. Thus, via holes VH1 are formed in the copper foil 74 and the prepreg insulating layer 70 to reach the upper surface of the wiring layer 61.

When the copper foil 54 and the prepreg insulating layer 60 on the lower surface side are similarly processed by the laser, via holes VH2 are formed in the copper foil 54 and the prepreg insulating layer 60 to reach the lower surface of the wiring layer 61.

On this occasion, the copper foils 54 and 74 are processed directly by the laser. Accordingly, copper foil burrs B occur at opening ends of the via holes VH1 and VH2.

Figure 14B:
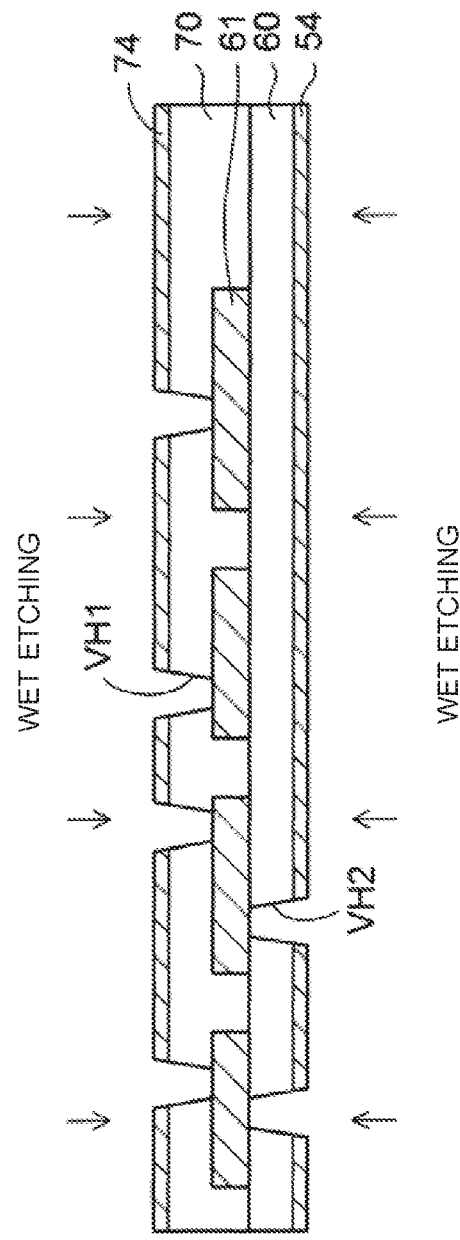

Therefore, as shown in FIG. 14B, the copper foil burrs B are etched by a copper wet etchant to be removed. Further, when the via holes VH1 and VH2 are internally dismeared by a potassium permanganate method etc., resin smears are removed and cleaned.

Figure 15:
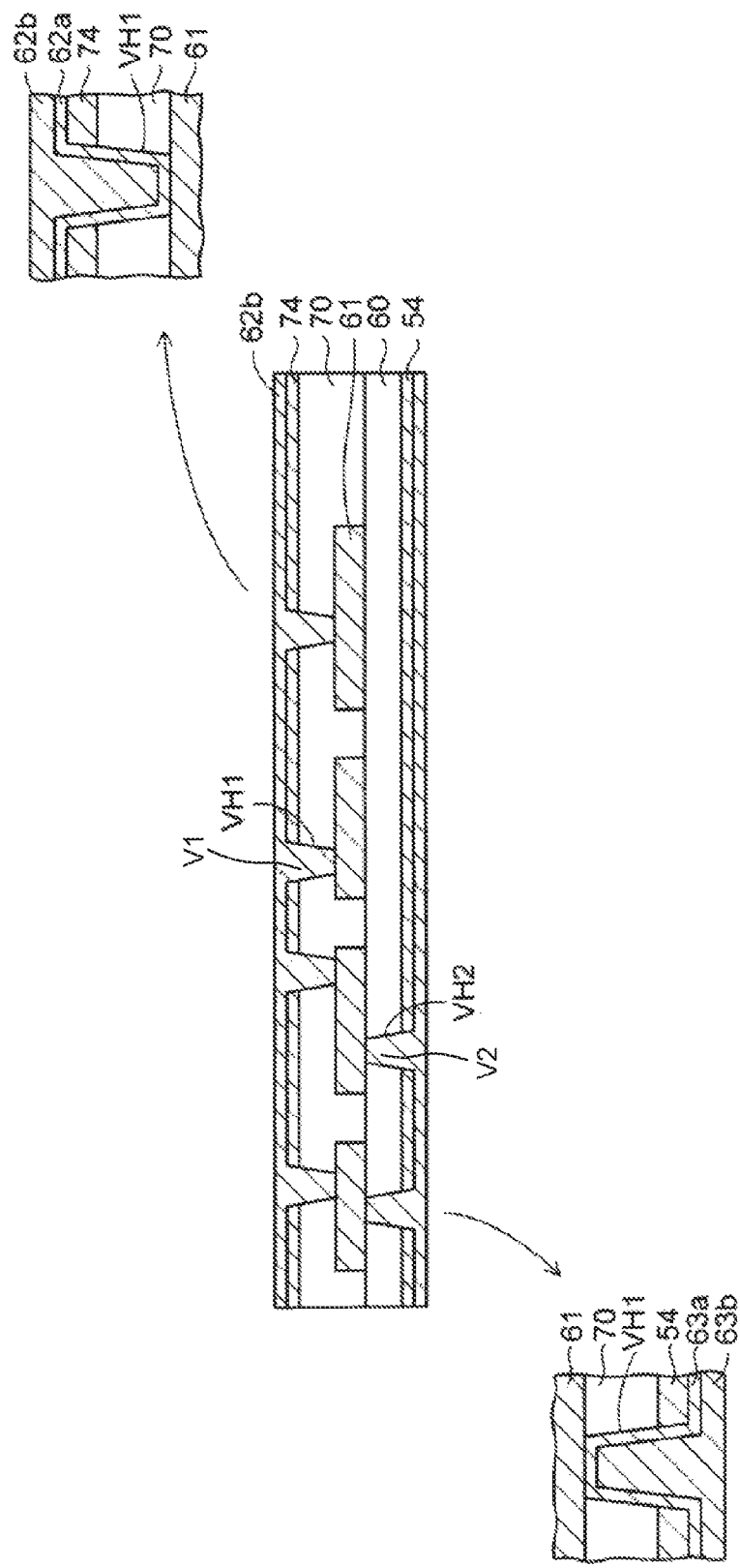
FIG. 15 is a sectional view (part 8) showing the method for manufacturing the upper wiring substrate for use in the electronic component device according to the embodiment.

Next, as shown in FIG. 15, a seed layer 62a made of copper etc. is formed on the inner surfaces of the via holes VH1 and the copper foil 74 on the upper surface side by electroless plating. In addition, a seed layer 63a made of copper etc. is similarly formed on the inner surfaces of the via holes VH2 and the copper foil 54 on the lower surface side.

Successively, metal plating layers 62b and 63b made of copper etc. are formed respectively on the seed layers 62a and 63a from the inside of the via holes VH1 and VH2 on the opposite surface sides by electrolytic plating using the seed layers 62a and 63a as plating power feed passages.

On this occasion, the via holes VH1 and VH2 are internally filled with the metal plating layers 62b and 63b on the opposite surface sides. Thus, a via conductor V1 is formed in the via hole VH1, and a via conductor V2 is formed in the via hole VH2.

Figure 16:
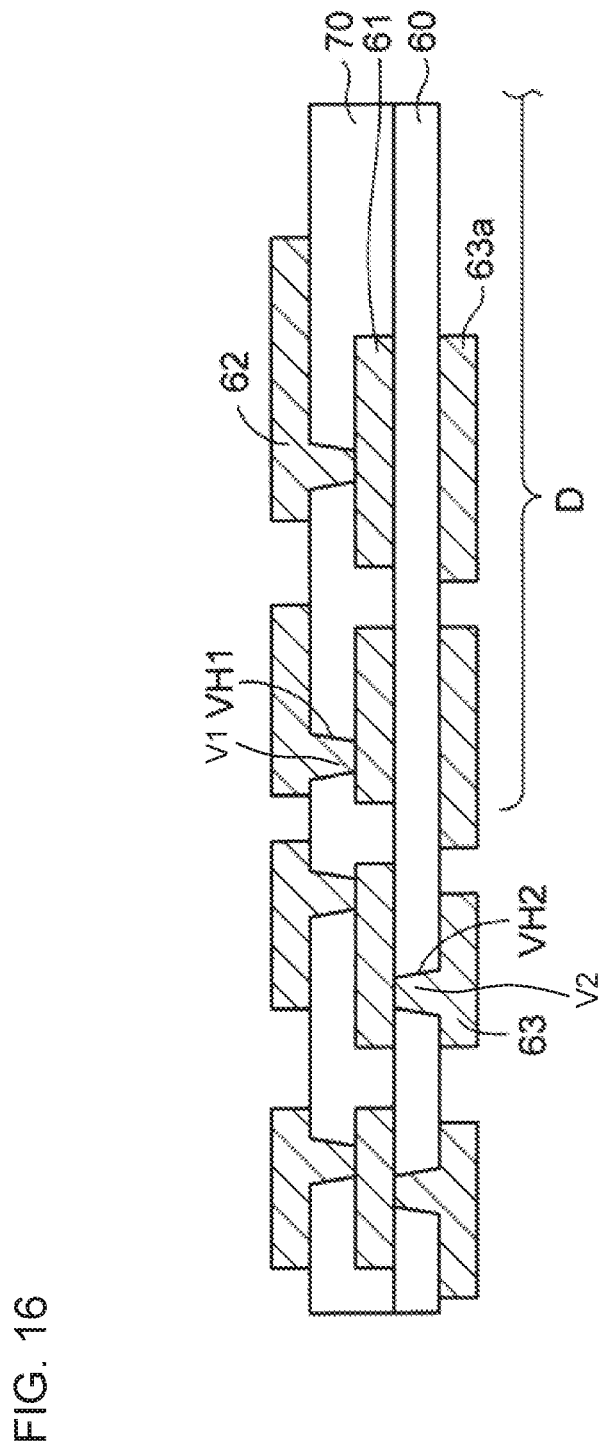
FIG. 16 is a sectional view (part 9) showing the method for manufacturing the upper wiring substrate for use in the electronic component device according to the embodiment.

Successively, as shown in FIG. 16, resist layers (not shown) are patterned respectively on the metal plating layers 62b and 63b on the opposite surface sides in FIG. 15 through photolithography. Further, the metal plating layers 62b and 63b and the seed layers 62a and 63a on the opposite surface sides are wet-etched respectively with the resist layers as masks.

Thus, a wiring layer 62 is formed on the prepreg insulating layer 70 to be connected to the upper surface of the wiring layer 61 through via conductors inside the via holes VH1. The wiring layer 62 is formed of the copper foil 74, the seed layer 62a and the metal plating layer 62b (FIG. 15) in the named order from bottom to top.

In addition, a wiring layer 63 is formed on the bottom of the prepreg insulating layer 60 to be connected to the lower surface of the wiring layer 61 through via conductors inside the via holes VH2. The wiring layer 63 is formed of the copper foil 54, the seed layer 63a and the metal plating layer 63b (FIG. 15) in the named order from top to bottom.

Although the wiring layers 62 and 63 are formed by a subtractive method in the example of FIGS. 15 and 16, a semi-additive method may be used alternatively.

In the upper wiring substrate according to the embodiment, neither wiring layer nor solder resist layer is finally provided in an electronic component opposing region D which is opposed to the semiconductor chips 40 and 42 in FIG. 7, in order to solve the problem in the aforementioned preliminary matter.

However, at the time point of the step in FIG. 16, a dummy wiring layer 63*a* formed of one and the same layer as the wiring layer 63 is temporarily disposed also in the electronic component opposing region D which is opposed to the semiconductor chips 40 and 42 in FIG. 7.

Figure 17A:
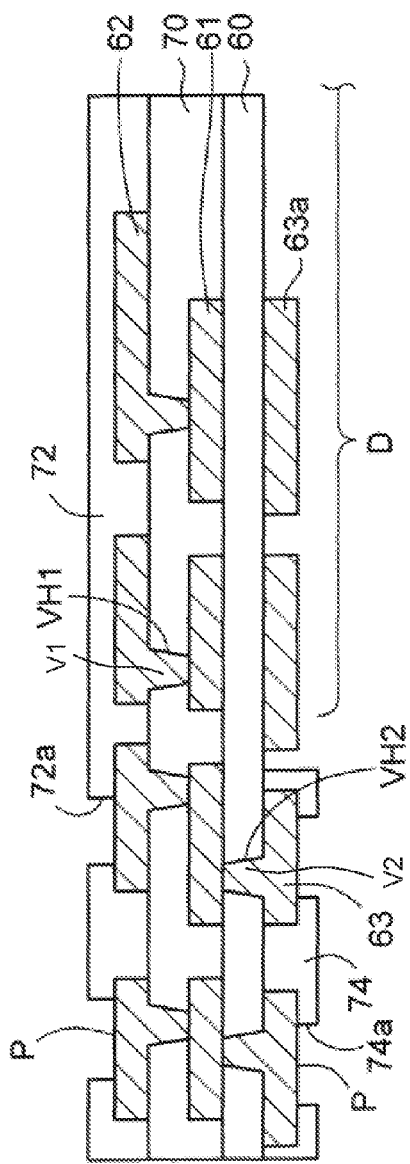
FIGS. 17A and 17B are a sectional view and a plan view (part 10) showing the method for manufacturing the upper wiring substrate for use in the electronic component device according to the embodiment.

Next, as shown in FIG. 17A, a solder resist layer 72 is formed on the prepreg insulating layer 70 so that opening portions 72*a* formed in the solder resist layer 72 are disposed on pads P of the wiring layer 62. Moreover, a solder resist layer 74 is similarly formed on the bottom of the prepreg insulating layer 60 so that opening portions 74*a* formed in the solder resist layer 74 are disposed on pads P of the wiring layer 63. The thickness of the solder resist layer 72, 74 is, for example, about 15 µm on the wiring layer 62, 63.

Each of the solder resist layers 72 and 74 is formed such that a photosensitive resin material such as an epoxy resin or an acrylic resin is formed and then exposed and developed based on photolithography. The resin material may be a resin film or may be a liquid resin.

A part of one product region is partially shown in the sectional view of FIG. 17A. An entire state of one product region on the lower of the wiring member in FIG. 17A is schematically shown in a reduced plan view of FIG. 17B. The sectional view of FIG. 17A corresponds to a section taken along a line II-II of the reduced plan view of FIG. 17B.

Figure 17B:
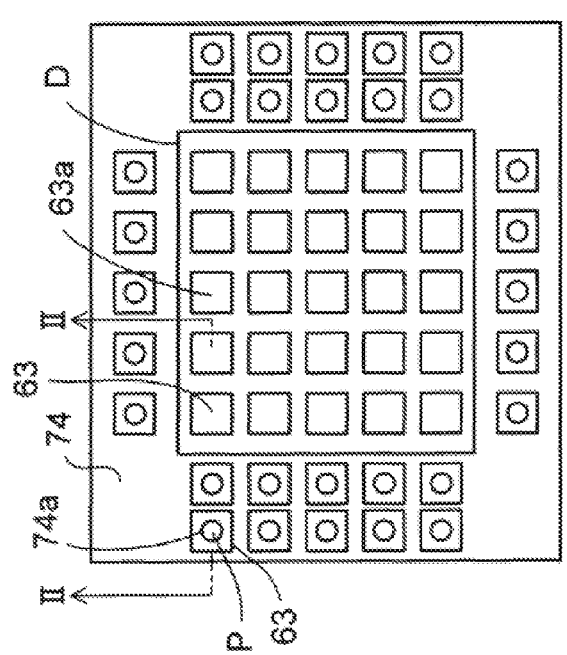

The wiring layer 63 and the dummy wiring layer 63*a* are depicted in perspective in the reduced plan view of FIG. 17B.

As shown in the reduced plan view of FIG. 17B, the wiring layer 63 including the pads P is disposed on a circumferential edge portion of the product region of the prepreg insulating layer 60. In addition, the solder resist layer 74 is formed on a circumferential edge portion of the product region of the prepreg insulating layer 60 so that the opening portions 74*a* formed in the solder resist layer 74 are disposed on the pads P of the wiring layer 63.

The dummy wiring layer 63*a* formed of one and the same layer as the wiring layer 63 is disposed in the electronic component opposing region D which is opposed to the semiconductor chips 40 and 42 in FIG. 7. The dummy wiring layer 63*a* is patterned and disposed in the whole of the electronic component opposing region D.

When the dummy wiring layer 63*a* is not disposed in the electronic component opposing region D in FIG. 17B here, a large opening portion is formed in a central portion of the product region to form a step structure.

For this reason, the solder resist layer 74 is apt to flow toward the large opening portion in the central portion, when the solder resist layer 74 is formed in the circumferential edge portion of the product region so that the opening portions 74*a* formed in the solder resist layer 74 are disposed on the pads P of the wiring layer 63. As a result, the solder resist layer 74 disposed in the circumferential edge portion of the product region is partially thin in thickness.

Accordingly, when conductive balls are mounted on the opening portions 74*a* of the solder resist layer 74 in a step which will be described later, there is a likelihood that the conductive balls may be displaced from the opening portions 74*a* of the solder resist layer 74 to thereby cause connection failure.

When the dummy wiring layer 63*a* is disposed in the electronic component opposing region D of the product region, the solder resist layer 74 can be formed uniformly with a sufficient thickness all over the surface on the prepreg insulating layer 60.

By electrolytic plating for forming a pattern of a copper layer, thickness uniformity inside the substrate tends to be poor in the case where an area subjected to the plating is small. Accordingly, when the dummy wiring layer 63*a* is formed, the thickness uniformity can be improved.

Then, in a state in which the lower surface side of the structure in FIG. 17A is protected by a protective sheet etc., nickel (Ni)/gold (Au) plating layers (not shown) are formed respectively on the pads P of the wiring layer 62 on the upper surface side in the named order from bottom to top by electrolytic plating.

Figure 18A:
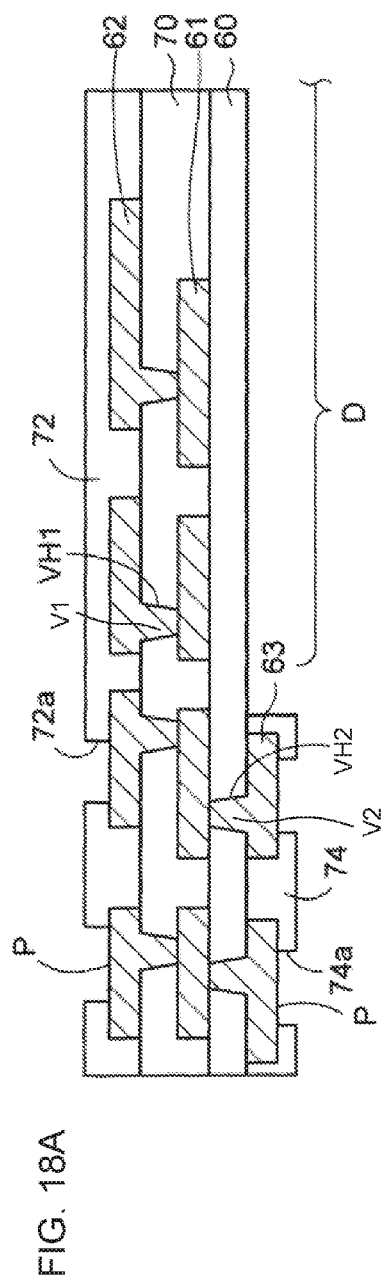
FIGS. 18A and 18B are a sectional view and a plan view (part 11) showing the method for manufacturing the upper wiring substrate for use in the electronic component device according to the embodiment.

Next, as shown in FIG. 18A, the dummy wiring layer 63*a* disposed in the electronic component opposing region D of the structure in FIGS. 17A and 17B is removed by wet etching.

Similarly to FIG. 17A, a part of one product region is partially shown in the sectional view of FIG. 18A. An entire state of one product region on the lower of the wiring member in FIG. 18A is schematically shown in the reduced plan view of FIG. 18B. The sectional view of FIG. 18A corresponds to a section taken along a line III-III of the reduced plan view of FIG. 18B.

Figure 18B:
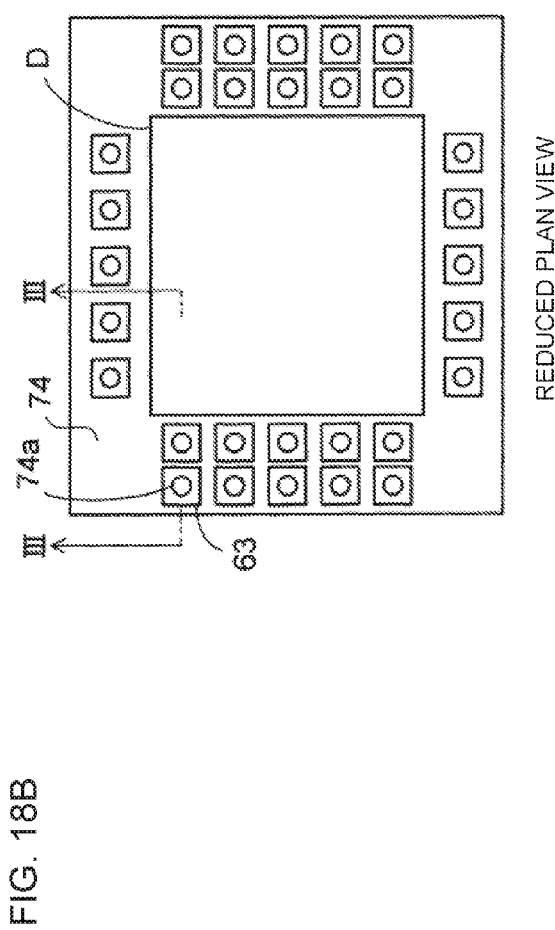

As shown in the reduced plan view of FIG. 18B, the pattern of the dummy wiring layer 63*a* disposed in the electronic component opposing region D on the lower surface side is entirely removed by wet etching.

The step is performed simultaneously with the step in which plating lines used when the nickel (Ni)/gold (Au) plating layers (not shown) are formed by the aforementioned electrolytic plating of FIG. 17A are removed by etchback.

The step is performed in a state in which the circumferential edge portions on the upper surface side and the lower surface side of the structure in FIG. 17A are protected by protective films etc. so as to prevent the wiring layer 62 on the upper surface side and the wiring layer 63 on the lower surface side from being etched.

In the aforementioned manner, it is possible to obtain a structure in which the wiring layer 63 and the solder resist layer 74 are not formed in the electronic component opposing region D which is opposed to the semiconductor chips 40 and 42 in FIG. 7.

In the above description, the solder resist layer 74 is an example of a first insulating layer and the prepreg insulating layer 60 is an example of a second insulating layer. The wiring layer 61 is formed on the upper surface of the prepreg insulating layer 60. The via holes VH2 are formed in the prepreg insulating layer 60 to reach the wiring layer 61.

The wiring layer 63 is formed all over the lower surface of the prepreg insulating layer 60 to be connected to the wiring layer 61 through the via holes VH2. Further, the solder resist layer 74 is formed in the circumferential edge portion of the lower surface of the prepreg insulating layer 60. Then, the wiring layer 63 formed as the dummy wiring layer 63*a* in the electronic component opposing region D is removed by wet etching.

Next, as shown in FIG. 19, conductive balls 64 are mounted on the pads P of the wiring layer 63 on the lower surface side. The conductive balls 64 are an example of bump conductors. Each of the conductive balls 64 is formed such that an outer surface of a copper ball 64*a* is covered with a solder layer 64*b*. Another metal ball than the copper ball may be used alternatively. The solder layers 64*b* of the conductive balls 64 are melted by heating to be connected to the pads P of the wiring layer 63.

On this occasion, the thickness of the solder resist layer 74 can be secured sufficiently as described above. Accordingly, the conductive balls 64 can be prevented from being displaced from the opening portions 74a of the solder resist layer 74 so that the conductive balls 64 can be mounted on the opening portions 74a of the solder resist layer 74 with high reliability.

Alternatively, a conductive ball in which a solder layer is formed on an outer surface of a resin ball may be used as each of the conductive balls 64. In addition, when an interval between the lower wiring substrate 2 and the upper wiring substrate 4 is large enough to allow some fluctuation in the interval, solder balls entirely made of solder may be used alternatively.

In the aforementioned manner, the upper wiring substrate 4 for use in the electronic component device according to the embodiment can be manufactured, as shown in FIG. 19.

As shown in FIG. 19, in the upper wiring substrate 4 for use in the electronic component device according to the embodiment, the wiring layer 61 is formed on the prepreg insulating layer 60. In addition, the prepreg insulating layer 70 is formed on the prepreg insulating layer 60 so that the via holes VH1 formed in the prepreg insulating layer 70 are disposed to reach the wiring layer 61.

Further, the wiring layer 62 is formed on the prepreg insulating layer 70 to be connected to the upper surface of the wiring layer 61 through the via conductors inside the via holes VH1. Each of the via holes VH1 is formed into a forward taper shape whose diameter is smaller from the upper surface of the prepreg insulating layer 70 toward the wiring layer 61.

The solder resist layer 72 is formed on the prepreg insulating layer 70 so that the opening portions 72a formed in the solder resist layer 72 are disposed on the pads P of the wiring layer 62.

In addition, the via holes VH2 are formed in the prepreg insulating layer 60 to reach the lower surface of the wiring layer 61. The wiring layer 63 is formed on the bottom of the prepreg insulating layer 60 to be connected to the lower surface of the wiring layer 61 through the via conductors inside the via holes VH2.

Each of the via holes VH2 is formed into a reverse taper shape whose diameter is smaller from the lower surface of the prepreg insulating layer 60 toward the wiring layer 61. The via hole VH2 is formed into a reverse taper shape to that of the via hole VH1.

The solder resist layer 74 is formed in the circumferential edge portion of the lower surface of the prepreg insulating layer 60 so that the opening portions 74a formed in the solder resist layer 74 are disposed on the pads P of the wiring layer 63. The conductive balls 64 are mounted on the pads P of the wiring layer 63.

The solder resist layer 74 is an example of the first insulating layer. The prepreg insulating layer 60 is an example of the second insulating layer.

As described in the aforementioned reduced plan view of FIG. 18B, the wiring layer 63 including the pads P and the solder resist layer 74 are disposed in the circumferential edge portion of the product region. The wiring layer 63 and the solder resist layer 74 are not formed in the electronic component opposing region D in the central portion of the product region.

This is because the electronic component opposing region D of the upper wiring substrate 4 is defined above each electronic component mounted on the lower wiring substrate when the electronic component device is constructed as will be described later. Since the wiring layer 63 and the solder resist layer 74 are not formed in the electronic component opposing region D of the upper wiring substrate 4 (in other words, the wiring layer 63 and the solder resist layer 74 are not opposed to the semiconductor chips 40, 42 in the thickness direction of the electronic component device 1), an interval between the upper surface of the electronic component and the lower surface of the upper wiring substrate can be widened.

There is another method different from the embodiment as follows. That is, after a dummy wiring layer is formed as an integral pattern in the electronic component opposing region D of the upper wiring substrate 4, an opening portion is formed in the dummy wiring layer by a router so that the dummy wiring layer can be removed. In the case of this method, a large concave warp occurs easily in the upper wiring substrate 4.

However, according to the embodiment, the dummy wiring layer 63a is entirely removed by wet etching after the dummy wiring layer 63a is patterned and formed in the electronic component opposing region D of the upper wiring substrate 4. Therefore, only a slight concave warp occurs in the upper wiring substrate 4 so that occurrence of the warp can be suppressed.

Moreover, according to the embodiment, the warp occurring at the upper wiring substrate 4 is slight and the thickness of the upper wiring substrate 4 is also thin. Therefore, the warp can be corrected easily by vacuum suction or by heat treatment at about 100° C.

In addition, according to the embodiment, the wiring member 9 formed on the support 5 is separated from the support 5 and the separated wiring member 9 is processed to manufacture the upper wiring substrate 4, as described previously. Thus, the upper wiring substrate 4 can be manufactured as a coreless type wiring substrate from which a core substrate is absent.

Therefore, even when a multilayer wiring structure is constructed, the total thickness can be reduced. In the example of FIG. 19, wiring is routed in the wiring layer 61 and the wiring layer 62 and the pads P are disposed in the wiring layer 63. The number of the provided multilayer wiring layers in the upper wiring substrate 4 can be set desirably.

Further, the upper wiring substrate 4 according to the embodiment is manufactured by the method for manufacturing a coreless type wiring substrate. It is not necessary to execute a special step which might lower the yield. Therefore, the upper wiring substrate 4 can be manufactured with high reliability substantially in the same manufacturing yield as the general upper wiring substrate described in the preliminary matter. Thus, when the upper wiring substrate 4 is connected to the lower wiring substrate 2, they can be connected to each other highly reliably without lowering the yield.

In addition, as shown in FIG. 19, in the upper wiring substrate 4 according to the embodiment, the wiring layer 61 is not embedded in the prepreg insulating layer 60 which is exposed after the dummy wiring layer 63a is removed. The wiring layer 61 is embedded in the prepreg insulating layer 70 on the upper.

Therefore, in the upper wiring substrate 4, flatness of the lower surface of the prepreg insulating layer 60 serving as the surface of the electronic component opposing region D can be secured. Accordingly, when a sealing resin is filled in a space between the lower wiring substrate 2 mounted with semiconductor chips and the upper wiring substrate 4, it can be filled smoothly, as will be described later.

Next, a method for mounting the upper wiring substrate 4 in FIG. 19 on the aforementioned semiconductor module 3 in FIG. 7 will be described.

Figure 20:
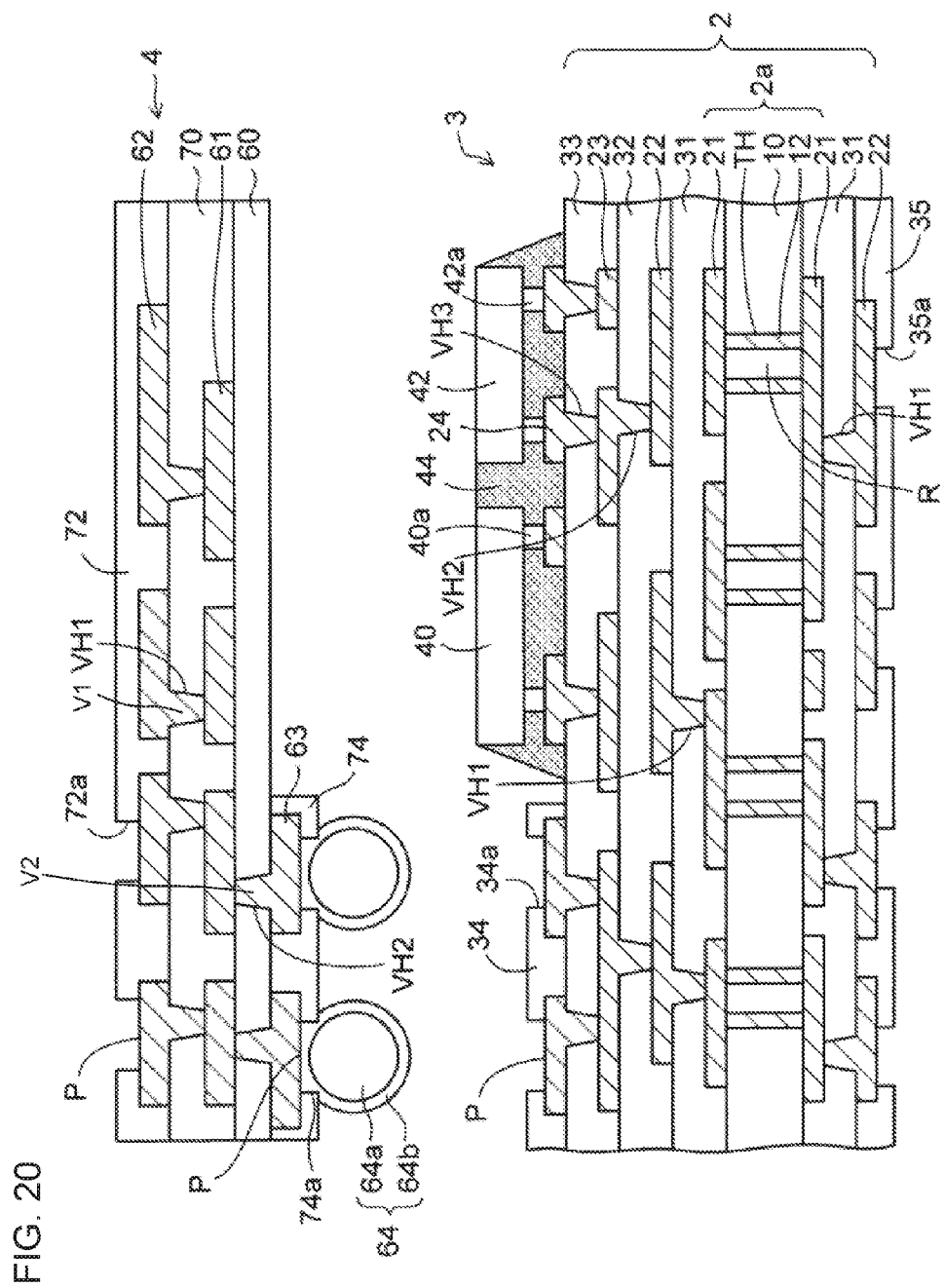
FIG. 20 is a sectional view (part 1) showing a method for manufacturing the electronic component device according to the embodiment.

As shown in FIG. 20, first, the aforementioned semiconductor module 3 in FIG. 7 and the upper wiring substrate 4 in FIG. 19 are prepared. The upper surface of the upper wiring substrate 4 is sucked by a bonding tool (not shown) so that the conductive balls 64 of the upper wiring substrate 4 are aligned with and disposed on the pads P of the wiring layer 24 of the semiconductor module 3 respectively.

Figure 21:
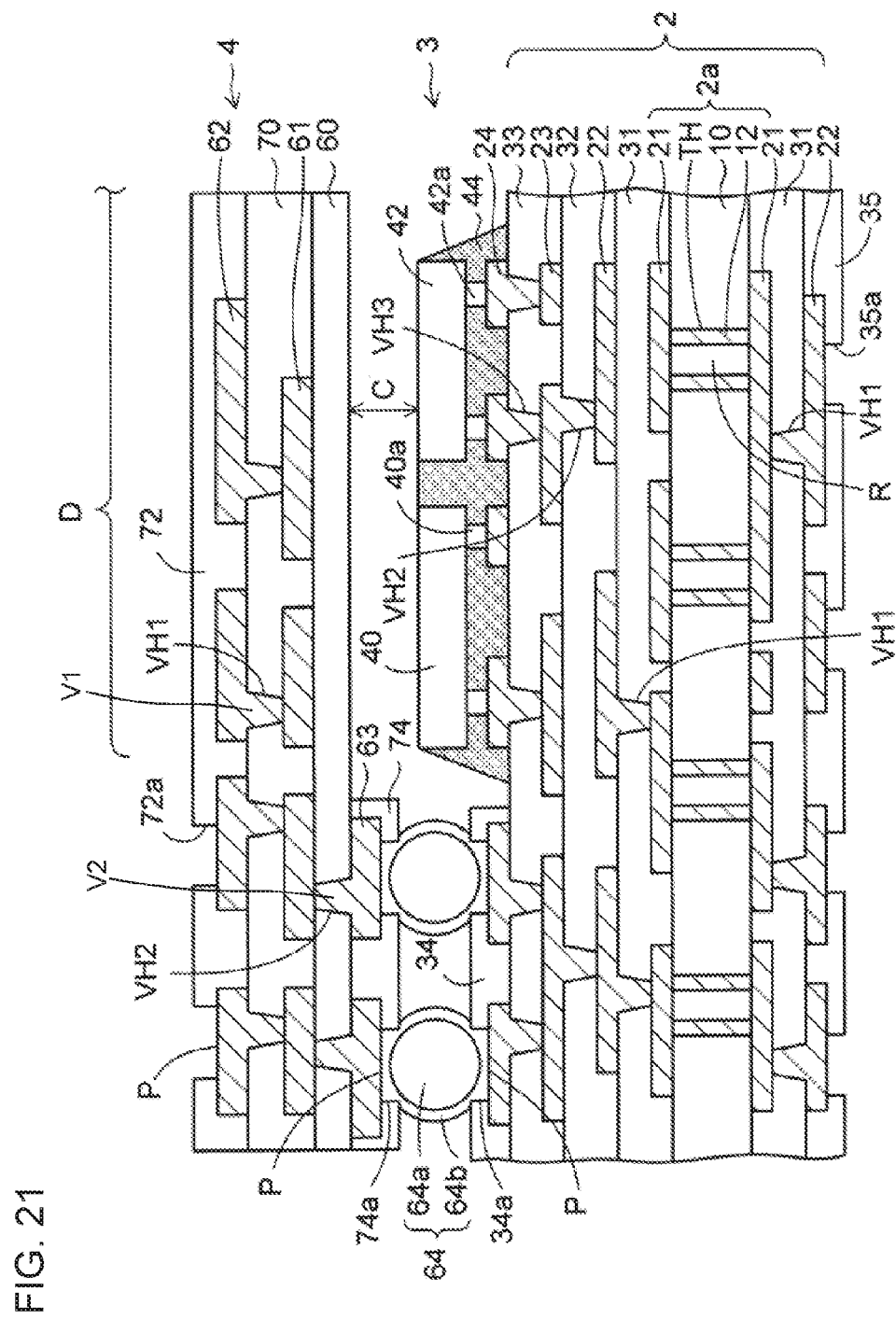
FIG. 21 is a sectional view (part 2) showing the method for manufacturing the electronic component device according to the embodiment.

Further, refer to FIG. 21 additionally. When the upper wiring substrate 4 is thermocompression-bonded by the bonding tool, the solder layers 64b of the conductive balls 64 of the upper wiring substrate 4 are directly connected to the pads P of the wiring layer 24 of the semiconductor module 3. Thus, the upper wiring substrate 4 is mounted on the lower wiring substrate 2 via the conductive balls 64 such that the upper wiring substrate 4 is electrically connected to the lower wiring substrate 2.

The pads P (the reduced plan view of FIG. 18B) of the wiring layer 63 of the upper wiring substrate 4 are arranged side by side and disposed in the circumferential edge portion of the product region so as to correspond to the pads P (the reduced plan view of FIG. 5B) of the wiring layer 24 of the semiconductor module 3. Therefore, the upper wiring substrate 4 can be disposed on the semiconductor module 3 through the conductive balls 64 without inclination.

On this occasion, the wiring layer 63 and the solder resist layer 74 are not formed in the electronic component opposing region D in the lower surface of the prepreg insulating layer 60 of the upper wiring substrate 4, as described previously. Therefore, an interval C between the upper surface of each of the semiconductor chips 40 and 42 and the lower surface of the upper wiring substrate 4 can be secured widely correspondingly to the thickness of the wiring layer 63 and the thickness of the solder resist layer 74.

When, for example, the thickness of the solder resist layer 74 of the upper wiring substrate 4 is 15 μm and the thickness of the wiring layer 63 is 10 μm, the interval C can be widen correspondingly to 25 μm.

When the same pitch of conductive balls as that in FIG. 1 of the aforementioned preliminary matter is used, the interval C between the upper surface of each of the semiconductor chips 40 and 42 and the lower surface of the upper wiring substrate 4 can be set to be wide in the range of from 15 μm to 40 μm (25 μm+15 μm).

Figure 22:
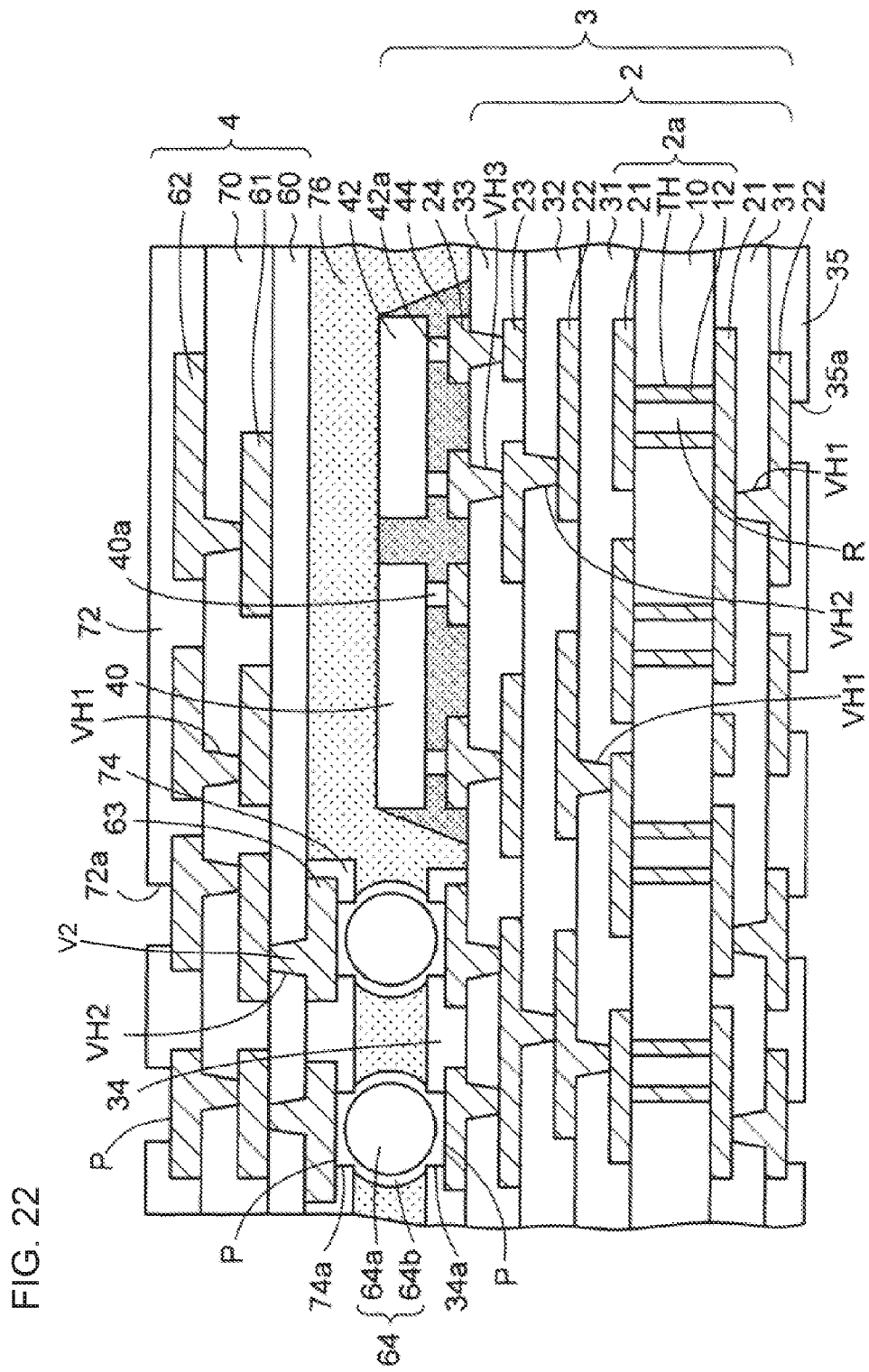
FIG. 22 is a sectional view (part 3) showing the method for manufacturing the electronic component device according to the embodiment.

Next, as shown in FIG. 22, a space between the semiconductor module 3 and the upper wiring substrate 4 is filled with a sealing resin 76 such as an epoxy resin. In this manner, the semiconductor chip 40, the semiconductor chip 42 and the conductive balls 64 are sealed by the sealing resin 76.

On this occasion, the interval C between the upper surface of the semiconductor chip 40, 42 and the lower surface of the upper wiring substrate 4 can be secured sufficiently to be not narrower than 40 μm. Therefore, the space between the semiconductor module 3 and the upper wiring substrate 4 can be filled with the sealing resin 76 with high reliability.

In addition, as described previously, the surface of the electronic component opposing region D (FIG. 21) of the upper wiring substrate 4 is flat. Therefore, the sealing resin 76 can be filled smoothly.

Further, for example, solder balls are mounted on connection portions of the wiring layer 22 on the lower surface side of the lower wiring substrate 2 to thereby form external connection terminals T, as shown in FIG. 23. Then, necessary parts of the upper wiring substrate 4 and the lower wiring substrate 2 are cut so that individual product regions can be obtained.

In the aforementioned manner, the electronic component device 1 according to the embodiment can be obtained, as shown in FIG. 23.

As shown in FIG. 23, the respective terminals 40a and 42a of the semiconductor chips 40 and 42 are respectively flip-chip connected to the connection portions of the wiring layer 24 in the component mounting region M of the aforementioned lower wiring substrate 2 which has been described in FIG. 5, in the electronic component device 1 according to the embodiment. A space under the semiconductor chips 40 and 42 is filled with the underfill resin 44.

The semiconductor chips 40 and 42 are mounted on the lower semiconductor substrate 2. In this manner, the semiconductor module 3 can be constructed.

In addition, the aforementioned upper wiring substrate 4 which has been described in FIG. 19 is disposed above the lower wiring substrate 2 through the conductive balls 64. The conductive balls 64 are disposed between the pads P of the wiring layer 24 in the circumferential edge portion of the lower wiring substrate 2 and the pads P of the wiring layer 63 in the circumferential edge portion of the upper wiring substrate 4.

The pads P of the wiring layer 24 of the lower wiring substrate 2 and the pads P of the wiring layer 63 of the upper wiring substrate 4 are electrically connected to each other through the conductive balls 64. Each of the conductive balls 64 is formed such that the outer surface of the copper ball 64a is covered with the solder layer 64b.

In this manner, the semiconductor chips 40 and 42 are received in the region between the lower wiring substrate 2 and the upper wiring substrate 4.

In addition, the space between the lower wiring substrate 2 with the semiconductor chips 40 and 42 and the upper wiring substrate 4 is filled with the sealing resin 76. The semiconductor chips 40 and 42 and the conductive balls 64 are sealed by the sealing resin 76. The external connection terminals T are provided in the wiring layer 22 on the lower surface side of the lower wiring substrate 2.

As described previously, in the electronic component device 1 according to the embodiment, the wiring layer 63 and the solder resist layer 74 are not formed in the component mounting region D provided on the lower surface side of the upper wiring substrate 4 correspondingly to the semiconductor chips 40 and 42 which are mounted on the lower wiring substrate 2. In other words, the insulating layer 60 is opposed to the semiconductor chips 40, 42 in the thickness direction of the electronic component device 1, whereas the wiring layer 63 and the solder resist layer 74 are not opposed to the semiconductor chips 40, 42 in the thickness direction.

In this manner, the interval C between the semiconductor chips 40 and 42 and the upper wiring substrate 4 can be widened correspondingly to the total thickness of the wiring layer 63 and the solder resist layer 74 of the upper wiring substrate 4.

Therefore, it is possible to fill the space between the lower wiring substrate 2 and the upper wiring substrate 4 with high reliability with the sealing resin 76 for sealing the semiconductor chips 40 and 42.

Thus, it is possible to sufficiently secure the interval C between the semiconductor chips 40 and 42 and the upper wiring substrate 4 without reducing the thickness of each of the semiconductor chips 40 and 42. In addition, it is possible to sufficiently secure the interval C between the semiconductor chips 40 and 42 and the upper wiring substrate 4 without increasing the diameter of each of the conductive balls 64.

In the aforementioned manner, it is possible to sufficiently secure the interval C between the semiconductor chips 40 and 42 and the upper wiring substrate 4 while narrowing the disposition pitch of the conductive balls 64.

As described previously, it is not possible to sufficiently secure a gap above each semiconductor chip in the structure in FIG. 1 according to the preliminary matter when the disposition pitch of the conductive balls is 200 µm and the thickness of the semiconductor chip including each terminal is 100 µm.

On the other hand, by use of the structure according to the embodiment, even with the pitch of the conductive balls described in the preliminary matter, it is possible to manufacture an electronic component device with high reliability.

An entire state of the electronic component device 1 according to the embodiment is shown in FIG. 24. As shown in FIG. 24, the semiconductor chips 40 and 42 are mounted on the central portion of the lower wiring substrate 2 of the electronic component device 1. In the lower wiring substrate 2 depicted in FIG. 24, its internal wiring structure is not shown.

The central portion of the lower surface of the upper wiring substrate 4 of the electronic component device 1 serves as the electronic component opposing region D corresponding to the semiconductor chips 40 and 42. The upper wiring substrate 4 has the prepreg insulating layer 60. The wiring layer 63 is formed on the circumferential edge portion of the lower surface of the prepreg insulating layer 60.

In addition, the solder resist layer 74 is formed on the circumferential portion of the lower surface of the prepreg insulating layer 60 so that the wiring layer 63 is covered with the solder resist layer 74 in the state in which the opening portions 74a are disposed on the connection portions of the wiring layer 63.

The wiring layer 63 and the solder resist layer 74 are not formed in the electronic component opposing region D in the central portion of the lower surface of the prepreg insulating layer 60. Accordingly, the electronic component opposing region D is exposed from the wiring layer 63 and the solder resist layer 74.

An electronic component device 1a according to a modification of the embodiment is shown in FIG. 25. In the aforementioned electronic component device 1 shown in FIGS. 23 and 24, the upper wiring substrate 4 is connected to the lower wiring substrate 2 through the conductive balls 64.

Metal posts 66 made of copper etc. may be formed on the pads P of the wiring layer 63 of the upper wiring substrate 4 and connected to the pads P of the wiring layer 24 of the lower wiring substrate 2 through solders 67 as in the electronic component device 1a in the modification in FIG. 25. In this manner, the metal posts 66 may be used as bump conductors.

The disposition pitch using the metal posts 66 can be made narrower than the disposition pitch using the conductive balls 64.

As an example of a method for forming the metal posts 66, first, a seed layer is formed all over the lower surface of the aforementioned structure in FIG. 18A. Next, a plating resist layer is formed so that opening portions formed in the plating resist layer are disposed on the pads P of the wiring layer 63.

Next, a columnar metal plating layer made of copper etc. is formed in the opening portions of the plating resist layer by electrolytic plating. Successively, the plating resist layer is removed. Further, the seed layer is removed by etching with the metal plating layer as a mask. In this manner, the metal posts 66 formed of the seed layer and the columnar metal plating layer can be obtained. Alternatively, long and narrow metal components may be bonded by solders etc. to form the metal posts.

Other members in FIG. 25 are the same as those in FIG. 23. Therefore, the other members are referred to by the same signs respectively and correspondingly and description thereof is omitted.

As described above, the exemplary embodiment and the modification are described in detail. However, the present invention is not limited to the above-described embodiment and the modification, and various modifications and replacements are applied to the above-described embodiment and the modifications without departing from the scope of claims.

The present disclosure will be summarized as follows.

According to the present disclosure, an electronic component device includes: a lower wiring substrate; an electronic component disposed on the lower wiring substrate; an upper wiring substrate disposed above the lower wiring substrate and the electronic component; a bump conductor disposed between the lower wiring substrate and the upper wiring substrate so as to electrically connect the lower wiring substrate and the upper wiring substrate; and a sealing resin provided between the lower wiring substrate and the upper wiring substrate so as to seal the electronic component and the bump conductor. The upper wiring substrate includes: a first wiring layer directly connected to the bump conductor; and a first insulating layer having an opening portion through which the first wiring layer is exposed and disposed to cover the first wiring layer. The first wiring layer and the first insulating layer are not opposed to the electronic component in a thickness direction of the electronic component device.

Thus, even when the diameter of each of the bump conductors for connecting the lower wiring substrate and the upper wiring substrate to each other is reduced to thereby narrow the pitch of the bump conductors, the interval between the electronic component and the upper wiring substrate can be widened correspondingly to the total thickness of the first wiring layer and the first insulating layer.

Therefore, it is possible to sufficiently secure the interval between the electronic component and the upper wiring substrate while narrowing the disposition pitch of the bump conductors. Accordingly, it is possible to fill the space between the lower wiring substrate and the upper wiring substrate with the sealing resin with high reliability.

Various aspects of the subject matter described herein are set out non-exhaustively in the following numbered clauses:

1) A method of manufacturing an electronic component device, the method comprising:

(a) disposing an electronic component on a lower wiring substrate;

(b) preparing an upper wiring substrate comprising a first wiring layer and a first insulating layer having an opening portion through which the first wiring layer is exposed and disposed to cover the first wiring layer;

(c) mounting the upper wiring substrate on the lower wiring substrate via a bump conductor so as to electrically connect the upper wiring substrate and the lower wiring substrate, wherein the bump conductor is directly connected to the first wiring layer exposed through the opening portion; and (d) providing a sealing resin between the lower wiring substrate and the upper wiring substrate so as to seal the electronic component and the bump conductor, wherein in the step (c), the upper wiring substrate is mounted on the lower wiring substrate via the bump conductor such that the first wiring layer and the first insulating layer are not opposed to the electronic component in a thickness direction of the electronic component device.

2) The method according to clause (1),
wherein the upper wiring substrate further comprises:
a second insulating layer having a via hole and disposed on the first insulating layer;
a via conductor provided in the via hole so as to be connected to the first wiring layer; and
a second wiring layer disposed on the second insulating layer so as to be connected to the via conductor.

3) The method according to clause (2), wherein the step (b) comprises:
b1) forming the second wiring layer on one surface of the second insulating layer;
b2) forming a via hole through the second insulating layer;
b3) forming a via conductor in the via hole;
b4) forming the first wiring layer on the other surface of the second insulating layer; and
b5) forming the first insulating layer on the other surface of the second insulating layer in a region other than an electronic component opposing region in which the second insulating layer is opposed to the electronic component, so as to cover the first wiring layer; and
b6) removing the first wiring layer formed in the electronic component opposing region.

4) The method according to clause (1), wherein the first wiring layer comprises a seed layer and a metal plating layer disposed on the seed layer.

5) The method according to clause (2), wherein
the first insulating layer is a solder resist layer, and
the second insulating layer is formed of a prepreg.

What is claimed is:

1. An electronic component device comprising:
a lower wiring substrate;
an electronic component disposed on the lower wiring substrate;
an upper wiring substrate disposed above the lower wiring substrate and the electronic component in a thickness direction of the electronic component;
a bump conductor disposed between the lower wiring substrate and the upper wiring substrate so as to electrically connect the lower wiring substrate and the upper wiring substrate; and
a sealing resin provided between the lower wiring substrate and the upper wiring substrate so as to seal the electronic component and the bump conductor,
wherein the upper wiring substrate comprises:
a first wiring layer directly connected to the bump conductor; and
a first insulating layer having an opening portion through which the first wiring layer is exposed and disposed to cover the first wiring layer, and
wherein an entirety of the first wiring layer and an entirety of the first insulating layer do not overlay the electronic component in the thickness direction of the electronic component device.

2. The electronic component device according to claim 1, wherein the upper wiring substrate further comprises:
a second insulating layer having a via hole and disposed on the first insulating layer;
a via conductor provided in the via hole so as to be connected to the first wiring layer; and
a second wiring layer disposed on the second insulating layer so as to be connected to the via conductor;
wherein the second insulating layer overlays the electronic component in the thickness direction of the electronic component device.

3. The electronic component device according to claim 2, wherein
the first insulating layer is a solder resist layer, and
the second insulating layer is formed of a prepreg.

4. The electronic component device according to claim 1, wherein the bump conductor is a conductive ball comprising a metal ball and a solder layer covering a surface of the metal ball.

5. The electronic component device according to claim 1, wherein the first wiring layer comprises a seed layer and a metal plating layer disposed on the seed layer.

6. The electronic component device according to claim 1, wherein the first wiring layer and the first insulating layer are entirely spaced from the electronic component in a lateral direction of the electronic component device, the lateral direction of the electronic component device being perpendicular of the thickness direction of the electronic component device.

7. The electronic component device according to claim 6, wherein the upper wiring substrate further comprises:
a second insulating layer having a via hole and disposed on the first insulating layer;
a via conductor provided in the via hole so as to be connected to the first wiring layer; and
a second wiring layer disposed on the second insulating layer so as to be connected to the via conductor;
wherein the second insulating layer is not entirely spaced from the electronic component in the lateral direction of the electronic component device.

8. The electronic component device according to claim 1, wherein the bump conductor is a metal post.

9. The electronic component device according to claim 1, wherein the lower wiring substrate comprises:
a third wiring layer directly connected to the bump conductor; and
a third insulating layer having an opening portion through which the third wiring layer is exposed and disposed to cover the third wiring layer,
wherein the electronic component does not overlay the third insulating layer in the thickness direction of the electronic component device.

10. The electronic component device according to claim 9, wherein the first wiring layer exposed through the opening portion of the first insulating layer and the third wiring layer exposed through the opening portion of the third insulating layer are directly connected to the bump conductor.

* * * * *